(12) United States Patent  
Miyanaga

(10) Patent No.: US 7,884,676 B1
(45) Date of Patent: Feb. 8, 2011

(54) PLL/FLL CIRCUIT WITH GAIN CONTROL

(75) Inventor: Kenji Miyanaga, Osaka (JP)

(73) Assignee: Panasonic Corporation, Osaka (JP)

( * ) Notice: Subject to any disclaimer, the term of this patent is extended or adjusted under 35 U.S.C. 154(b) by 59 days.

(21) Appl. No.: 12/534,663

(22) Filed: Aug. 3, 2009

(51) Int. Cl.
*H03L 7/00* (2006.01)

(52) U.S. Cl. .................... 331/16; 331/1 A; 331/1 R; 331/34; 375/373; 375/347; 375/375; 375/376; 455/260

(58) Field of Classification Search ............ 331/1 A, 331/16, 34; 455/260; 375/373, 374, 375, 375/376
See application file for complete search history.

(56) References Cited

U.S. PATENT DOCUMENTS 7,616,067 B2 * 11/2009 Matsumoto et al. ........... 331/16

FOREIGN PATENT DOCUMENTS

JP 2007-507985 3/2007

* cited by examiner

*Primary Examiner*—Arnold Kinkead
(74) *Attorney, Agent, or Firm*—Wenderoth, Lind & Ponack, L.L.P.

(57) ABSTRACT

An FLL circuit having a capability of configuring a desired loop bandwidth in a short period of time is provided. An FDC 17 generates a feedback of an output signal of a VCO 15. An error detector 11 detects an error of the output signal of the VCO 15. A voltage retainer 13 retains an output of a control voltage of the VCO 15. A reference signal generator 16 generates a reference signal. An adder 14 adds the reference signal to a control voltage outputted by the voltage retainer 13. A Kv calculator 18 calculates a gain Kv of the VCO 15 based on a degree of transition of an output frequency of the VCO 15. A loop bandwidth controller 19 adjusts, based on the gain Kv of the VCO 15, a gain of a loop filter 12 to an optimum value, and configures a desired loop bandwidth.

14 Claims, 18 Drawing Sheets

PLL/FLL CIRCUIT WITH GAIN CONTROL

BACKGROUND OF THE INVENTION

1. Field of the Invention

The present invention relates to an FLL (Frequency locked loop) circuit, a PLL (Phase locked loop) circuit, and a wireless communication circuit, which are applied in a frequency synthesizer, a frequency modulation circuit, and the like; and more specifically, relates to an FLL circuit, a PLL circuit, and a wireless communication device that uses the FLL circuit and/or the PLL circuit, all having a capability of configuring a loop bandwidth to a desired bandwidth in a short period of time.

2. Description of the Background Art

FIG. 15 is a block diagram showing a configuration of a conventional FLL circuit 500 that is used as a frequency synthesizer. In FIG. 15 the conventional FLL circuit 500 includes: a frequency error detector 501; a loop filter 502; a VCO (Voltage Controlled Oscillator) 503; and an FDC (Frequency Digital Converter) 504. Within the FLL circuit 500, a control voltage that is in accordance with an input signal is supplied to the VCO 503 via the frequency error detector 501 and the loop filter 502. The VCO 503 generates an output signal having a frequency that is in accordance with the control voltage. The FDC 504 detects the frequency of the output signal of the VCO 503, converts the frequency into a digital signal, and outputs the resulting digital signal to the frequency error detector 501. The frequency error detector 501 compares the input signal and the output signal of the FDC 504, and detects an error between a frequency of the input signal and the frequency of the output signal of the VCO 503. The conventional FLL circuit 500 operates so as to reduce an output from the frequency error detector 501 to zero; which means, to equalize the frequency of the input signal and the frequency of the output signal of the VCO 503. A conventional FLL circuit controls the frequency of the output signal of the VCO 503 by means of a feedback control that uses a closed-loop as described above. Descriptions of the PLL circuit are omitted, since the PLL circuit has a configuration that is largely similar to that of the FLL circuit 500.

However, with the conventional FLL/PLL circuit 500, when a sensitivity of the VCO 503 fluctuates due to a process variation and a temperature fluctuation, a loop bandwidth will also fluctuate as a result. If the loop bandwidth fluctuates and veers away from an optimum value, various problems, such as degradation of output frequency precision and requirement of longer time until the FLL/PLL circuit locks up, arise due to influences such as a noise within a loop band, nonlinearity of the VCO 503, and the like.

In order to solve this problem, for example, a PLL circuit, which has a capability of configuring a loop bandwidth to a desired bandwidth even when the sensitivity of the VCO fluctuates, is disclosed in Japanese National Phase PCT Laid-Open Publication No. 2007-507985 (hereinafter, described as patent document 1). FIG. 16 is a block diagram showing one example of a conventional PLL circuit 510 disclosed in patent document 1. In the conventional PLL circuit 510, a Kv measuring circuit 514 measures control voltages V1 and V2 of a VCO 513 when an output signal of the VCO 513 is locked at frequencies f1 and f2, and then measures a gain Kv of the VCO 513 by using formula 1. The Kv controller 515 controls a level of a charge-pump current that is outputted by a charge pump 511, such that a product, obtained by multiplying the measured gain Kv of the VCO 513 by the charge-pump current, becomes constant.

$$Kv=(f2-f1)/(V2-V1) \qquad \text{(formula 1)}$$

However, the conventional PLL circuit 510 disclosed in patent document 1 has the following problem. It is necessary for the conventional PLL circuit 510 to lock up output frequencies f1 and f2 of the VCO 513 by means of a closed-loop control when measuring control voltages V1 and V2 of the VCO 513. Since output frequencies are converged to a desired frequency by utilizing an error of the VCO 513 output signal as a feedback, there is a limit in shortening a lock up time. Furthermore, in order to obtain a measurement precision that is sufficient, it is necessary to wait for a sufficient period of time after locking the output frequencies f1 and f2 of the VCO 513 before measuring the control voltages V1 and V2; thus ensuring measurement precision also requires time. Therefore, the conventional PLL circuit 510 disclosed in patent document 1 has a problem, which is the difficulty in configuring the loop bandwidth to a desired bandwidth in a short period of time.

SUMMARY OF THE INVENTION

Therefore an objective of the present invention is to provide an FLL circuit, a PLL circuit, and a wireless communication device that uses the FLL circuit and/or the PLL circuit, all having a capability of configuring a loop bandwidth to a desired bandwidth in a short period of time.

The present invention is directed toward an FLL/PLL circuit. In order to achieve the above-described objective, the FLL/PLL circuit of the present invention is directed toward an FLL/PLL circuit that generates, based on an input signal, an output signal having a desired frequency. The FLL/PLL circuit includes: a VCO which is supplied with a control voltage that is in accordance with an input signal and which generates an output signal having a desired frequency that is in accordance with the control voltage; a feedback section that generates a feedback of the output signal of the VCO; an error detector that detects an error of the output signal of the VCO by comparing the generated feedback of the output signal of the VCO and the input signal; a loop filter which suppresses a high-frequency component of an output signal of the error detector, and which inputs the resulting signal into the VCO; a voltage retainer that retains an output of the control voltage of the VCO obtained when locked up at a first frequency; a reference signal generator that generates a predefined reference signal when the voltage retainer retains the output of the control voltage of the VCO; an adder that adds the reference signal to the control voltage outputted by the voltage retainer; a Kv calculator that calculates a gain Kv of the VCO, based on a degree of transition of an output frequency of the VCO, which is a difference between an output frequency of the VCO when locked up at the first frequency and an output frequency of the VCO when the reference signal is added; and a loop bandwidth controller which configures, based on the gain Kv of the VCO calculated by the Kv calculator, a gain of the loop filter to an optimum value, and which configures a desired loop bandwidth.

Preferably, the voltage retainer: stops, while the reference signal generator is generating the reference signal, an operation of the loop filter by retaining the output of the control voltage of the VCO obtained when locked up at the first frequency; and restarts, when the reference signal generator stops generating the reference signal, the operation of the loop filter by inputting the output signal of the loop filter into the VCO.

The reference signal has a waveform that results in an output having a predefined voltage $V_D$ for only a predefined time period. If, the first frequency is defined as f1, the control voltage of the VCO obtained when locked up at the first frequency f1 is defined as V1, the output frequency of the VCO when the predefined voltage $V_D$ of the reference signal is added to the control voltage V1 is defined as f2, and the control voltage is defined as V2; the Kv calculator calculates the gain Kv of the VCO from the following formula.

$$Kv = (f2 - f1)/V2 - V1)$$
$$= (f2 - f1)V_D$$

Furthermore, the reference signal may have a waveform that results in an output having the predefined voltage $V_D$ for a predefined time period, and then in an output having a predefined voltage $-V_D$ for the next predefined time period. If, the first frequency is defined as f1, the control voltage of the VCO obtained when locked up at the first frequency f1 is defined as V1, the output frequency and the control voltage of the VCO when the predefined voltage $V_D$ of the reference signal is added to the control voltage V1 are respectively defined as f2 and V2, and the output frequency and the control voltage of the VCO when the predefined voltage $-V_D$ of the reference signal is added to the control voltage V1 are respectively defined as f3 and V3; the Kv calculator calculates the gain Kv of the VCO from the following formula.

$$Kv = (f2 - f3)/(V2 - V3)$$
$$= \left(\frac{f2}{2} - \frac{f3}{2}\right) / (V2 - V1)$$
$$= \left(\frac{f2}{2} - \frac{f3}{2}\right) / V_D$$

Furthermore, the reference signal may have a waveform that results in an output having the predefined voltage $V_D$ for a predefined time period, then in an output having the predefined voltage $-V_D$ for the next predefined time period, and then in an output having the predefined voltage $V_D$ for the next predefined time period. If, the first frequency is defined as f1, the control voltage of the VCO obtained when locked up at the first frequency f1 is defined as V1, the output frequency and the control voltage of the VCO when the predefined voltage $V_D$ of the reference signal is added to the control voltage V1 are respectively defined as f2 and V2, the output frequency and the control voltage of the VCO when the predefined voltage $-V_D$ of the reference signal is added to the control voltage V1 are respectively defined as f3 and V3, and the output frequency and the control voltage of the VCO when the next predefined voltage $V_D$ of the reference signal is added to the control voltage V1 are respectively defined as f4 and V4; the Kv calculator calculates the gain Kv of the VCO from the following formula.

$$Kv = (f2 + f4 - 2f3)/4(V2 - V1)$$
$$= (f2 + f4 - 2f3)/4V_D$$

The loop bandwidth controller configures a gain of the loop filter to an optimum value such that a product, obtained by multiplying the gain Kv of the VCO calculated by the Kv calculator and the gain of the loop filter, becomes a constant value.

A frequency channel signal and a modulation signal are inputted into the FLL/PLL circuit as the input signal. The FLL/PLL circuit may further include: a second adder which adds the frequency channel signal and the modulation signal, and which outputs the result to the error detector; a gain adjuster which multiplies the inputted modulation signal and a multiplication value, and which outputs the multiplied modulation signal to the VCO via the adder, and which adjusts an output frequency of the VCO; and a switch that switches a connection with the adder from the gain adjuster to the reference signal generator, while the reference signal generator is generating the reference signal.

The gain adjuster preferably adjusts the multiplication value based on the gain Kv of the VCO calculated by the Kv calculator.

Specifically, the gain adjuster: increases, when the gain Kv of the VCO calculated by the Kv calculator decreases, the multiplication value so as to suppress an influence of a decrease in the gain Kv of the VCO; and decreases, when the gain Kv of the VCO calculated by the Kv calculator increases, the multiplication value so as to suppress an influence of an increase in the gain Kv of the VCO.

Furthermore, the frequency channel signal and the modulation signal are inputted into the FLL/PLL circuit as the input signal. The FLL/PLL circuit may further include: the second adder which adds the frequency channel signal and the modulation signal, and which outputs the result to the error detector; the gain adjuster which multiplies the inputted modulation signal and the multiplication value, and which outputs the multiplied modulation signal to the VCO via the adder, and which adjusts the output frequency of the VCO; and a switch that switches the output, from the modulation signal to the reference signal, while the reference signal and the modulation signal are being inputted and while the reference signal generator is generating the reference signal.

The present invention may be a wireless communication device that includes the FLL/PLL circuit described above.

As described above, with the FLL/PLL circuit according to the present invention, the output frequency of the VCO can be measured in a short period of time, by applying the reference signal to the control voltage of the VCO after switching to an open-loop. As a result, a desired loop bandwidth can be configured in a short period of time.

These and other objectives, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
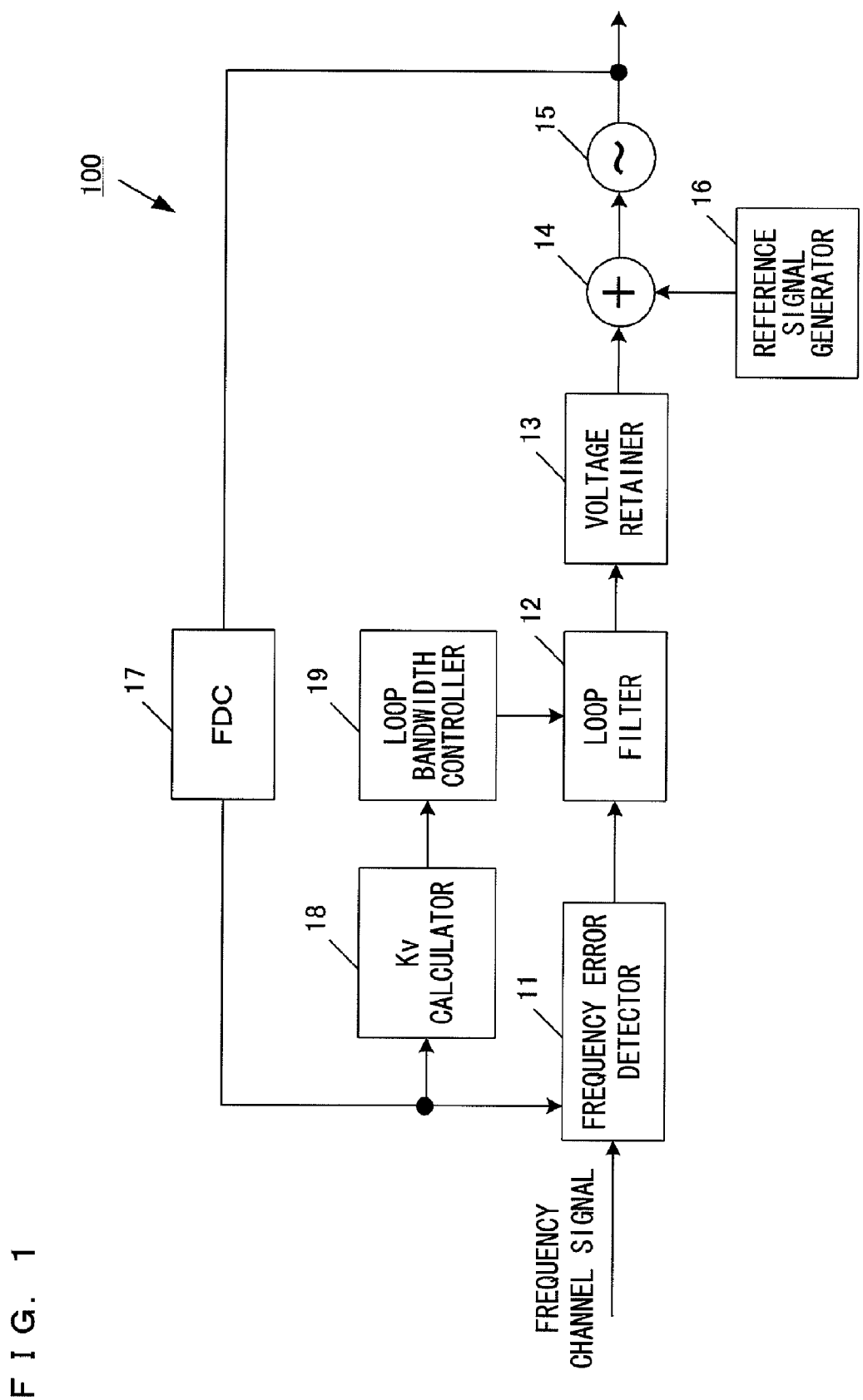
FIG. 1 is a block diagram showing one example of a configuration of an FLL circuit 100 according to a first embodiment of the present invention.

FIG. 1 is a block diagram showing one example of a configuration of an FLL circuit 100 according to a first embodiment of the present invention. The FLL circuit 100 shown in FIG. 1 is applied in a frequency synthesizer. In FIG. 1, the FLL circuit 100 includes: a frequency error detector 11; a loop filter 12; a voltage retainer 13; an adder 14; a VCO 15; a reference signal generator 16; an FDC 17; a Kv calculator 18; and a loop bandwidth controller 19.

A frequency channel signal indicating a desired output frequency is inputted into the FLL circuit 100. In the FLL circuit 100, a control voltage that is in accordance with the frequency channel signal is supplied to the VCO 15, via the frequency error detector 11, the loop filter 12, the voltage retainer 13, and the adder 14. The VCO 15 generates an output signal having a frequency that is in accordance with the control voltage. The FDC 17 detects the frequency of the output signal of the VCO 15, conducts a digital conversion thereon, and outputs the converted result to the frequency error detector 11 and the Kv calculator 18. The FDC 17 may be referred to as a feedback section, since the FDC 17 includes a configuration for generating a feedback of the output signal of the VCO 15. The frequency error detector 11 compares the inputted frequency channel signal and the output signal of the FDC 17, and detects an error between a frequency of an input signal and a frequency of an output signal of the VCO 15.

The loop filter 12 suppresses a high-frequency component of an output signal of the frequency error detector 11. The voltage retainer 13 retains an output of the control voltage of the VCO 15 obtained when locked up at a desired frequency. While the voltage retainer 13 is retaining the output of the control voltage of the VCO 15, an operation in a closed-loop is temporally suspended, and the FLL circuit 100 operates in an open-loop. Alternatively, the voltage retainer 13 directly outputs an output signal of the loop filter 12. In this case, the FLL circuit 100 operates in the closed-loop. Thus, the voltage retainer 13 can conduct a switching between the open-loop and the closed-loop.

The reference signal generator 16 generates a reference signal (e.g. later described in FIG. 3A and FIG. 3B), and outputs the reference signal to the adder 14. The adder 14 adds the output signal of the voltage retainer 13 and the reference signal generated by the reference signal generator 16. The Kv calculator 18 detects a gain of the VCO 15 (hereinafter, referred to as a gain Kv of the VCO) based on the output signal of the FDC 17. The loop bandwidth controller 19 configures a desired loop bandwidth based on the gain Kv of the VCO. Specifically, the loop bandwidth controller 19 configures a gain of the loop filter 12 to an optimum value such that a product, obtained by multiplying the gain Kv of the VCO by the gain of the loop filter 12, becomes a constant value.

Figure 2:
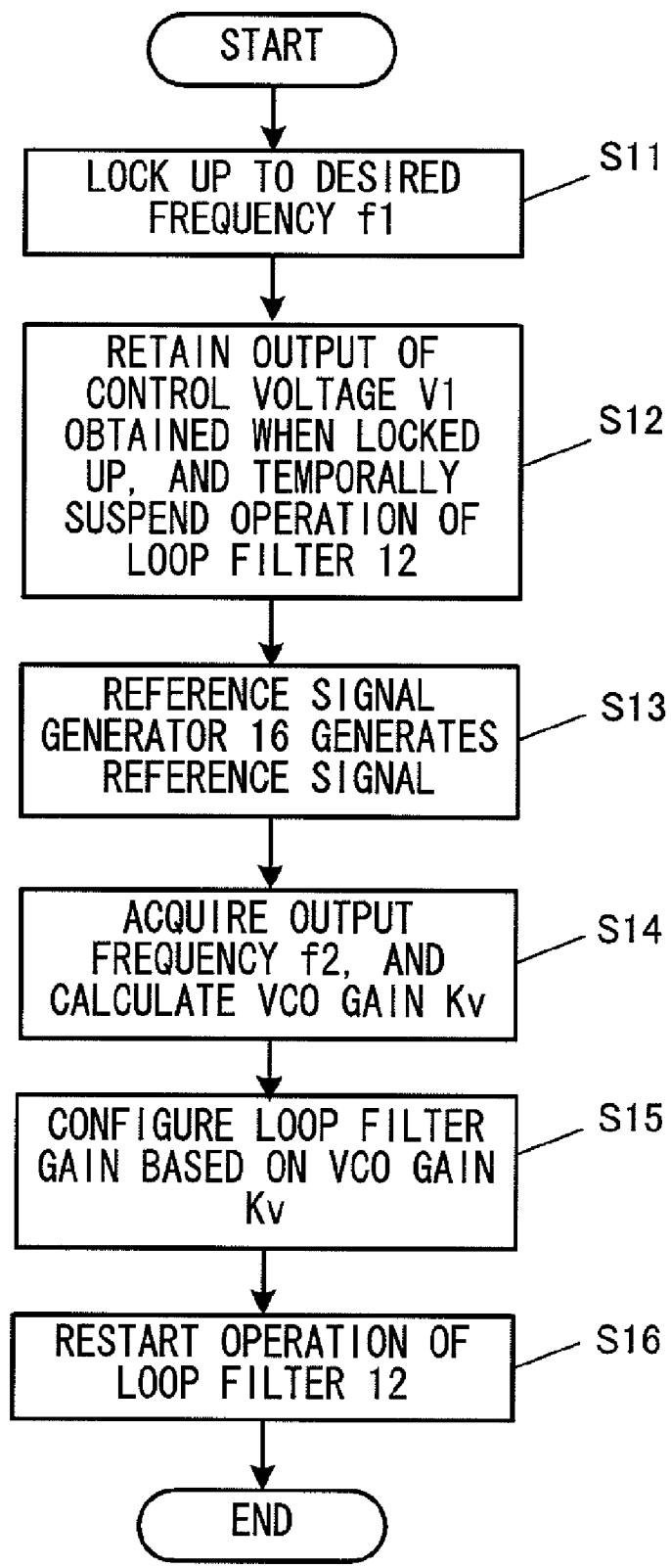
FIG. 2 is a flowchart describing an outline of an operation of the FLL circuit 100 according to the first embodiment of the present invention.

An operation of the FLL circuit 100 when configuring the loop bandwidth will be described next with reference to FIG. 2. FIG. 2 is a flowchart describing an outline of the operation of the FLL circuit 100. With reference to FIG. 2, first, the FLL circuit 100 operates in the closed-loop, and locks up the output frequency of the VCO 15 at a desired frequency f1 based on the frequency channel signal (step S11). Next, the Kv calculator 18 acquires the output frequency f1 of the VCO 15 via the FDC 17. Additionally, the voltage retainer 13 retains a value of the control voltage V1 of the VCO 15 obtained when locked up at the desired frequency f1, and temporally suspends the operation of the loop filter 12 (step S12). Therefore, the voltage retainer 13 switches the operation of the FLL circuit 100 to the open-loop.

Next, the reference signal generator 16 generates a predefined reference signal, and outputs the reference signal to the adder 14 (step S13). Here, the reference signal generator 16 generates a reference signal A shown in FIG. 3A. The reference signal A shown in FIG. 3A has a waveform that results in an output having a predefined voltage $V_D$ for a predefined time period T. The predefined voltage $V_D$ and the predefined time period T are configured to values that allow the Kv calculator 18 to calculate the gain Kv of the VCO with sufficient precision.

For example, if the predefined voltage $V_D$ is too small, a degree of transition of the output frequency of the VCO 15 detected by the FDC 17 becomes smaller than a resolution of the FDC 17. This leads to an inability of calculating a precise gain Kv of the VCO by the Kv calculator 18. On the other hand, if the predefined voltage $V_D$ is too large, the Kv calculator 18 cannot calculate the precise gain Kv of the VCO due to nonlinearity of the gain Kv of the VCO. Furthermore, if the predefined time period T is too small, the Kv calculator 18 cannot sufficiently average the output signal of the FDC 17, thus cannot calculate the precise gain Kv of the VCO due to noise. On the other hand, if the predefined time period T is too large, the Kv calculator 18 requires extra time to calculate the gain Kv of the VCO.

The adder 14 adds the control voltage V1 retained by the voltage retainer 13 and the reference signal generated by the reference signal generator 16; and outputs the result to the VCO 15. The control voltage and the output frequency of the VCO 15 at this moment are respectively defined as V2 and f2. Therefore, (f1, V1) and (f2, V2) in FIG. 3A indicate combinations of the output frequency and the control voltage of the VCO 15. The voltage $V_D$ of the reference signal can be obtained by formula 2.

$$V_D = V2 - V1 \qquad \text{(formula 2)}$$

Figure 4A:
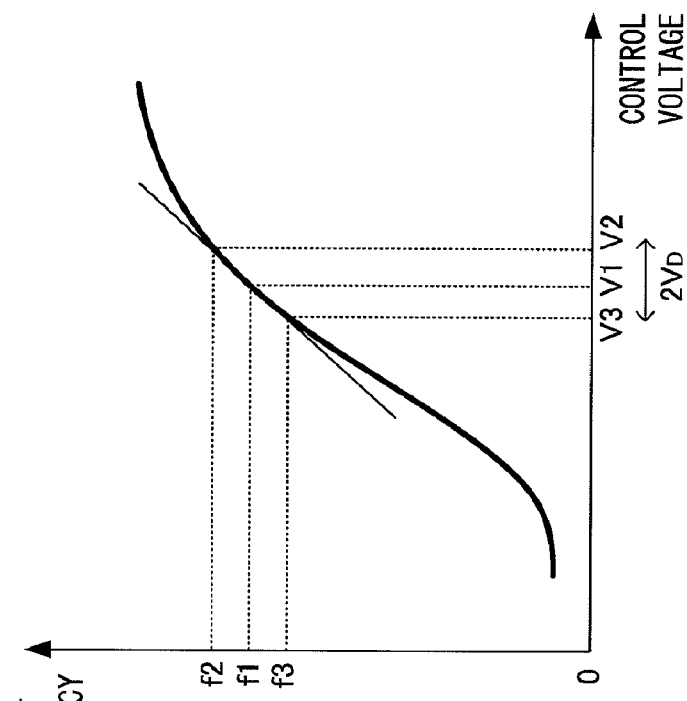
FIG. 4A shows a relationship between a control voltage and an output frequency of a VCO 15 (VF curve)

The Kv calculator 18 acquires the output frequency f2 of the VCO 15 via the FDC 17, and calculates the gain Kv of the VCO with a method described next (step S14). Here, a calculation method of the gain Kv of the VCO is described with reference to FIG. 4A. FIG. 4A shows a relationship between the control voltage and the output frequency of the VCO 15 (VF curve). As described above, the control voltage of the VCO 15 obtained when the output frequency of the VCO 15 is locked at f1 is defined as V1. In addition, the control voltage of the VCO 15 obtained when the output frequency of the VCO 15 is locked at f2 is defined as V2. The gain Kv of the VCO corresponds to an inclination of the VF curve. Therefore, the Kv calculator 18 can measure the gain Kv of the VCO by using formula 3. However, it is necessary to configure an interval (i.e. voltage $V_D$) between the control voltage V1 and the control voltage V2 to be sufficiently small, such that the inclination of the VF curve when the control voltage V1 is generated does not differ from the inclination of the VF curve when the control voltage V2 is generated.

$$Kv = (f2 - f1)/(V2 - V1) \qquad \text{(formula 3)}$$

Figure 3A:
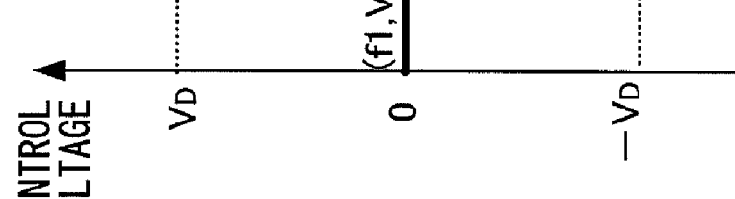
FIG. 3A shows one example of a waveform of a reference signal A generated by a reference signal generator 16.
Figure 3B:
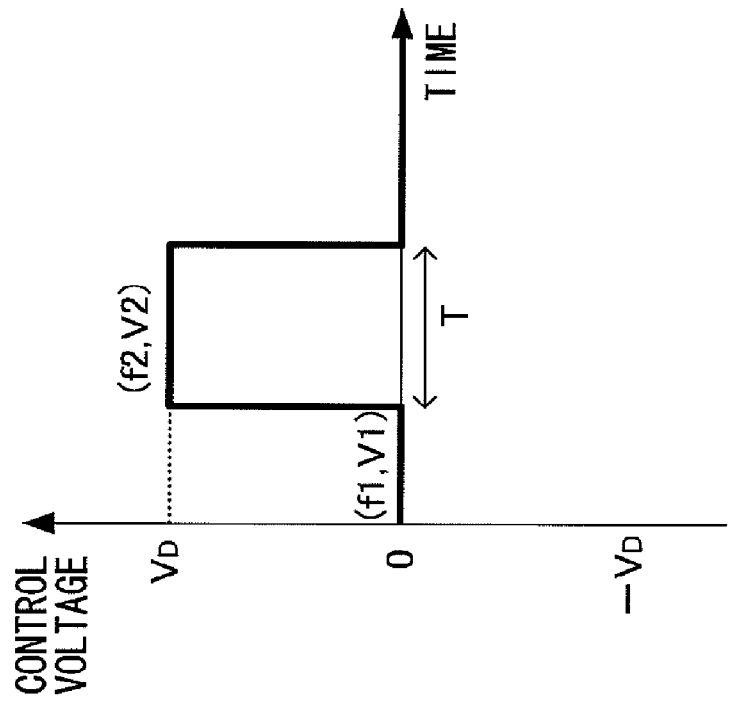
FIG. 3B shows one example of a waveform of a reference signal B generated by the reference signal generator 16.
Figure 4B:
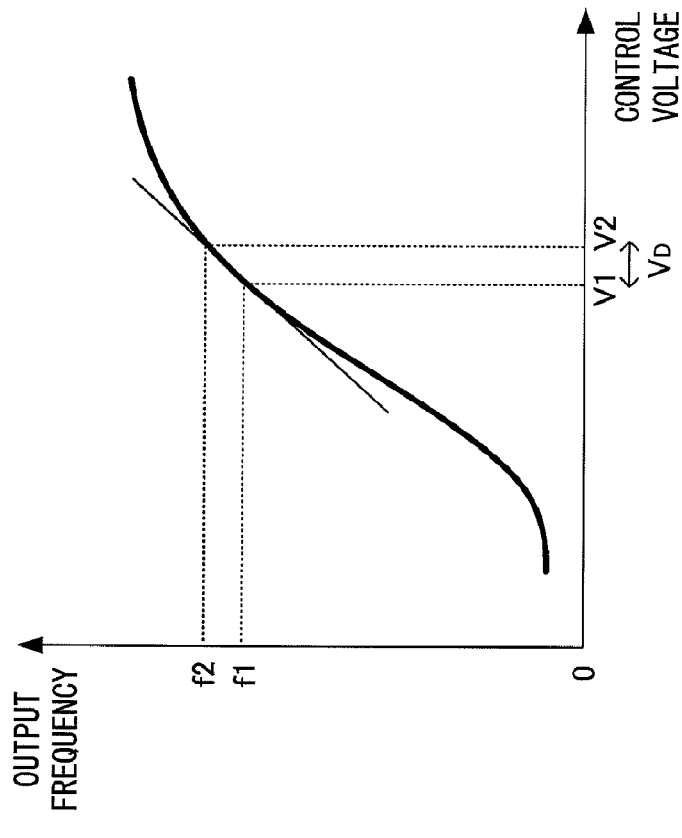
FIG. 4B shows a relationship between the control voltage and the output frequency of the VCO 15 (VF curve)

Furthermore, the reference signal generator 16 may generate, for example, a reference signal B as shown in FIG. 3B. The reference signal B shown in FIG. 3B has a waveform that results in an output having the predefined voltage $V_D$ for the predefined time period T, and then in an output having a predefined voltage $-V_D$ for the next predefined time period T. As shown in FIG. 4B, control voltages of the VCO 15 obtained when the output frequency of the VCO 15 is locked at f1, f2, and f3, are respectively defined as V1, V2, and V3. Here, the output frequency and the control voltage of the VCO 15 when the voltage of the reference signal B is $-V_D$ are respectively defined as f3 and V3. Therefore, (f1, V1), (f2, V2), and (f3, V3) in FIG. 3B indicate combinations of the output frequency and the control voltage of the VCO 15 at each respective time.

When the reference signal B is applied, the Kv calculator 18 can measure the gain Kv of the VCO by utilizing formula 4. Additionally, when the reference signal B is applied, the Kv calculator 18 can detect the gain Kv of the VCO with a precision that is better than when the reference signal A is applied, which is a result of averaging plus and minus of the reference signal. However, it is necessary to configure an interval (i.e. voltage $2V_D$) between the control voltage V2 and the control voltage V3 to be sufficiently small, such that there are no changes between inclinations of the VF curve when the control voltage V2 is generated and when the control voltage V3 is generated.

$$\begin{aligned} Kv &= (f2 - f3)/(V2 - V3) \\ &= \left(\frac{f2}{2} - \frac{f3}{2}\right)/(V2 - V1) \\ &= \left(\frac{f2}{2} - \frac{f3}{2}\right)/V_D \end{aligned} \qquad \text{(formula 4)}$$

Although the reference signal B in FIG. 3B has a waveform in which the predefined voltage $V_D$ and the predefined voltage $-V_D$ are generated continuously in this order without any interruptions; the reference signal B may be one in which, a waveform having the predefined voltage $V_D$ is generated, and then after a certain period of time, a waveform having the predefined voltage $-V_D$ is generated. Furthermore, although, in the reference signal B in FIG. 3B, the generated waveform results in the predefined voltage $V_D$, and the predefined voltage $-V_D$ that has the same absolute value as the predefined voltage $V_D$ but with inverted plus and minus of the predefined voltage $V_D$; the absolute value of the predefined voltage $V_D$, and the absolute value of the voltage with inverted plus and minus, do not necessary have to be identical. Furthermore, although, in the reference signal B, predefined voltages are generated in an order of, $V_D$ and then $-V_D$; the reference signal B may be one in which the predefined voltages are generate in the inverse order as, $-V_D$ and then $V_D$.

The reference signal A and the reference signal B described above indicate waveforms of typical reference signals, but the reference signal generator 16 can also generate a reference signal having a waveform that is different from those of the reference signal A and the reference signal B. Furthermore, the reference signal generator 16 may switch the reference signal that is to be generated, if necessary. For example, the reference signal generator 16 may generate the reference signal A when it is required to configure a desired loop bandwidth in a short period of time, and generate the reference signal B when it is required to configure a desired loop bandwidth with better precision. Moreover, the reference signal generator 16 may switch the reference signal that is to be generated, in accordance with the temperature of the VCO 15.

Next, the loop bandwidth controller 19 configures gains $K_1$ and $K_2$ of the loop filter 12 to optimum values based on the gain Kv of the VCO calculated by the Kv calculator 18 (step S15). Specifically, as indicated by formula 6 which is described later, the loop bandwidth can be maintained at a constant, if a product, obtained by multiplying the gain Kv of the VCO calculated by the Kv calculator 18 with the gain $K_1$ of the loop filter 12, is maintained at a constant value. Therefore, the loop bandwidth controller 19 configures the gains $K_1$ and $K_2$ of the loop filter 12 to the optimum values such that the product, obtained by multiplying the gain Kv of the VCO calculated by the Kv calculator 18 with the gain $K_1$ of the loop filter 12, becomes a constant value.

Next, one example of a calculation method for obtaining the optimum gains $K_1$ and $K_2$ of the loop filter 12 will be described. Here, a case in which a transfer function F(s) of the loop filter is represented by formula 5 is described as an example.

$$F(s) = K_1 + \frac{K_2}{s} \qquad \text{(formula 5)}$$

An open-loop gain G(s) of an FLL loop can be represented by formula 6. In addition, a transfer function H(s) for the closed-loop of the FLL loop can be represented by formula 7.

$$G(s) = F(s)\frac{K_v}{s} = \left(K_1 + \frac{K_2}{s}\right)\frac{K_v}{s} \quad \text{(formula 6)}$$

$$H(s) = \frac{G(s)}{1+G(s)} = \frac{K_1 K_v s + K_2 K_v}{s^2 + K_1 K_v s + K_2 K_v} = \frac{2\zeta\omega_n + \omega_n^2}{s^2 + 2\zeta\omega_n + \omega_n^2} \quad \text{(formula 7)}$$

Here, $\omega_n$ is a natural angle frequency and is a damping factor. Thus, $\omega_n$ and $\zeta$ can be represented as indicated by formula 8.

$$\omega_n = \sqrt{K_2 K_v},\ \zeta = \frac{K_1}{2}\sqrt{\frac{K_v}{K_2}} \quad \text{(formula 8)}$$

Generally, a loop bandwidth BW is defined as a frequency that results in |G(s)|=1 from formula 9. Since it becomes, $K_1 \gg K_2$, in a well designed FLL loop; the loop bandwidth BW can be obtained as an approximation as indicated by formula 10.

$$|G(s)|_{s=j2\pi f} = \left|K_1 - \frac{K_2}{j2\pi f}\right|\frac{K_2}{2\pi f} \quad \text{(formula 9)}$$

$$|G(s)|_{s=j2\pi f} \cong K_1 \frac{K_v}{2\pi BW} = 1 \quad \text{(formula 10)}$$

Therefore $BW = \frac{K_1 K_v}{2\pi}$

In a known state, if the gain of the VCO is $Kv_0$, and gains of the loop filter 12 are $K_{10}$ and $K_{20}$; a loop bandwidth $BW_0$ and a damping factor $\zeta_0$ can be obtained by using formula 11.

$$BW_0 = \frac{K_{10} Kv_0}{2\pi},\ \zeta_0 = \frac{K_{10}}{2}\sqrt{\frac{Kv_o}{K_{20}}} \quad \text{(formula 11)}$$

If a gain of the VCO fluctuates away from a known value $Kv_0$ and becomes Kv, when the optimum gains of the loop filter 12 are $K_1$ and $K_2$, a desired loop bandwidth $BW_{target}$ and a desired damping factor $\zeta_{target}$ can be obtained by using formula 12. It is generally preferred if the desired damping factor $\zeta_{Starget}$ is configured to be about 0.7(1/√2), when applied in the FLL (and PLL) circuit.

$$BW_{t\arg et} = \frac{K_1 K_v}{2\pi},\ \zeta_{t\arg et} = \frac{K_1}{2}\sqrt{\frac{K_v}{K_2}} \quad \text{(formula 12)}$$

As a result of formula 11 and formula 12, the optimum gains $K_1$ and $K_2$ of the loop filter 12 can be obtained from formula 13. More specifically, since $K_{10}$, $K_{20}$, Kvo, $\zeta_0$, $\zeta_{target}$, $BW_0$, and $BW_{target}$ are known values, and Kv can be calculated by the Kv calculator 18; the loop bandwidth controller 19 can calculate, by using formula 13, the gain $K_1$ and $K_2$ of the loop filter 12 that configures the desired loop bandwidth $BW_{target}$. This method is merely one example, and it is possible to calculate the gain $K_1$ and $K_2$ of the loop filter 12 by another method. Although, in the description above, an example where the transfer function F(s) of the loop filter 12 has two gains, $K_1$ and $K_2$, is described; F(s) may be represented by a formula other than the formula described above. For example, F(s) may be represented by a single gain, either $K_1$ or $K_2$ (e.g. F(s)=$K_1$, F(s)=$K_2$/s, and the like).

$$K_1 = K_{10}\frac{BW_{t\arg et}}{BW_0}\frac{Kv_0}{Kv} \quad \text{(formula 13)}$$

$$K_2 = K_{20}\left(\frac{\zeta_0}{\zeta_{t\arg et}}\frac{BW_{t\arg et}}{BW_0}\right)\frac{Kv_0}{Kv}$$

Next, the voltage retainer 13 directly outputs the output signal of the loop filter 12, and restarts the operation of the loop filter 12 (step S16). Thus, the voltage retainer 13 switches the operation of the FLL circuit 100 to the closed-loop. As a result of the operation described above, the FLL loop. circuit 100 is capable of configuring the desired loop bandwidth in a short period of time even when a sensitivity of the VCO 15 fluctuates.

Figure 5:
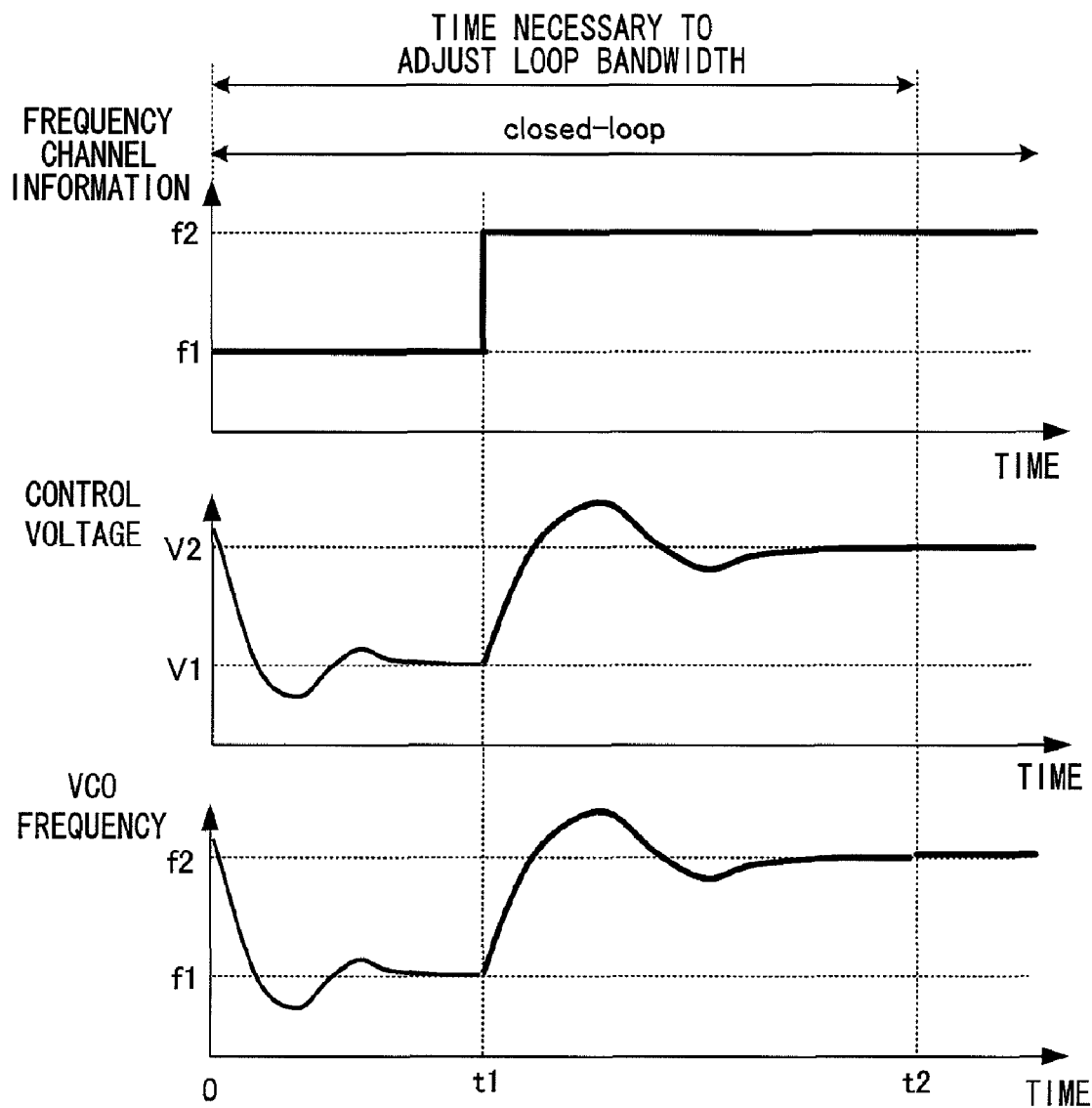
FIG. 5 shows the time necessary to configure a loop bandwidth of a conventional PLL circuit 510.
Figure 6A:
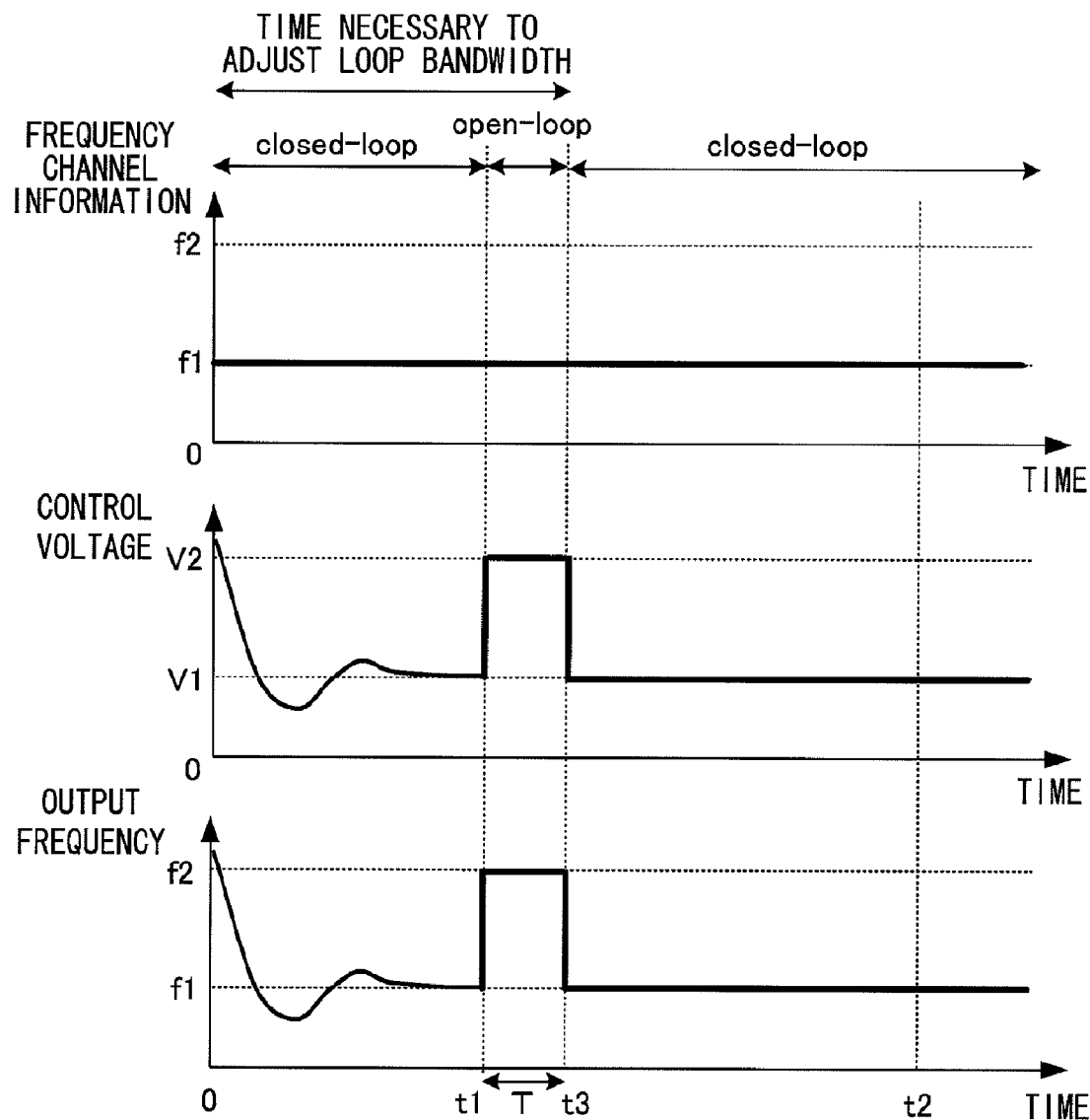
FIG. 6A shows the time necessary to configure a loop bandwidth of an FLL circuit 100 according to a first embodiment of the present invention.
Figure 6B:
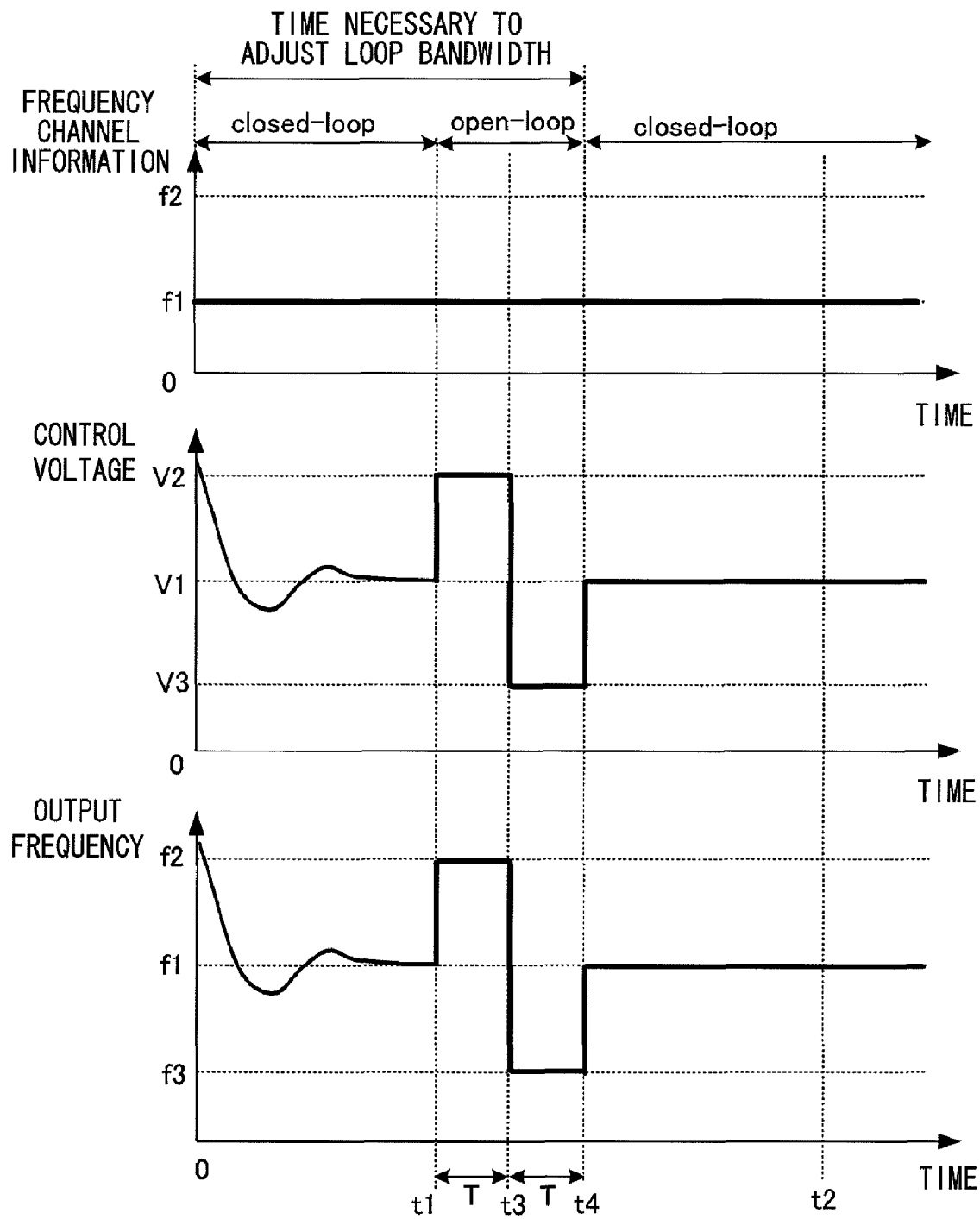
FIG. 6B shows the time necessary to configure the loop bandwidth of the FLL circuit 100 according to the first embodiment of the present invention.

Next, an advantageous effect of the invention of the present application will be describe with reference to FIG. 5, FIG. 6A, and FIG. 6B. FIG. 5 shows the time necessary to configure the loop bandwidth with a conventional PLL circuit 510 disclosed in patent document 1. FIG. 6A and FIG. 6B show the time necessary to configure the loop bandwidth with the FLL circuit 100 of the present application. The reference signal A shown in FIG. 3A is used in FIG. 6A. Additionally, the reference signal B shown in FIG. 3B is used in FIG. 6B.

As described above, with the conventional PLL circuit 510, it is necessary to lock up the output signal of the VCO 513 to the frequencies f1 and f2 in the closed-loop when measuring the control voltage V1 and V2 of the VCO 513. Thus, a time period t2 is necessary to adjust the loop bandwidth, as shown in FIG. 5. On the other hand, with reference to FIG. 6A, when measuring the control voltage V2 of the VCO 15, the FLL circuit 100 of the present application switches to the open-loop and locks up the output signal of the VCO 15 to the frequency 12. It is possible to control the output signal of the VCO 15 in a shorter period of time by conducting the control in the closed-loop rather than conducting the control in the open-loop. Therefore, configuring the loop bandwidth can be finished in a time period t3, which is shorter than the time period t2, when the reference signal A is used. Furthermore, with reference to FIG. 6B, when measuring the control voltages V2 and V3 of the VCO 15, the FLL circuit 100 of the present application switches to the open-loop and locks up the output signals of the VCO 15 to the frequencies f2 and f3. This takes a longer period of time, which is as much as T, than in the case in FIG. 6A; however, by conducting the control in the open-loop, configuring the loop bandwidth can be finished in a time period t4, which is shorter than the time period t2, even when the reference signal B is used.

As described above, with the FLL circuit 100 according to the first embodiment of the present invention, it is possible to measure the output frequency of the VCO 15 in a short period of time by switching to the open-loop and applying the reference signal to the control voltage of the VCO 15. As a result, the desired loop bandwidth can be configured in a short period of time.

Other than the frequency synthesizer, the FLL circuit 100 described above can be applied to a frequency modulation circuit. The frequency modulation circuit conducts a frequency modulation on an inputted modulation signal, and outputs the resulting signal as a frequency modulation signal.

Second Embodiment

Figure 7A:
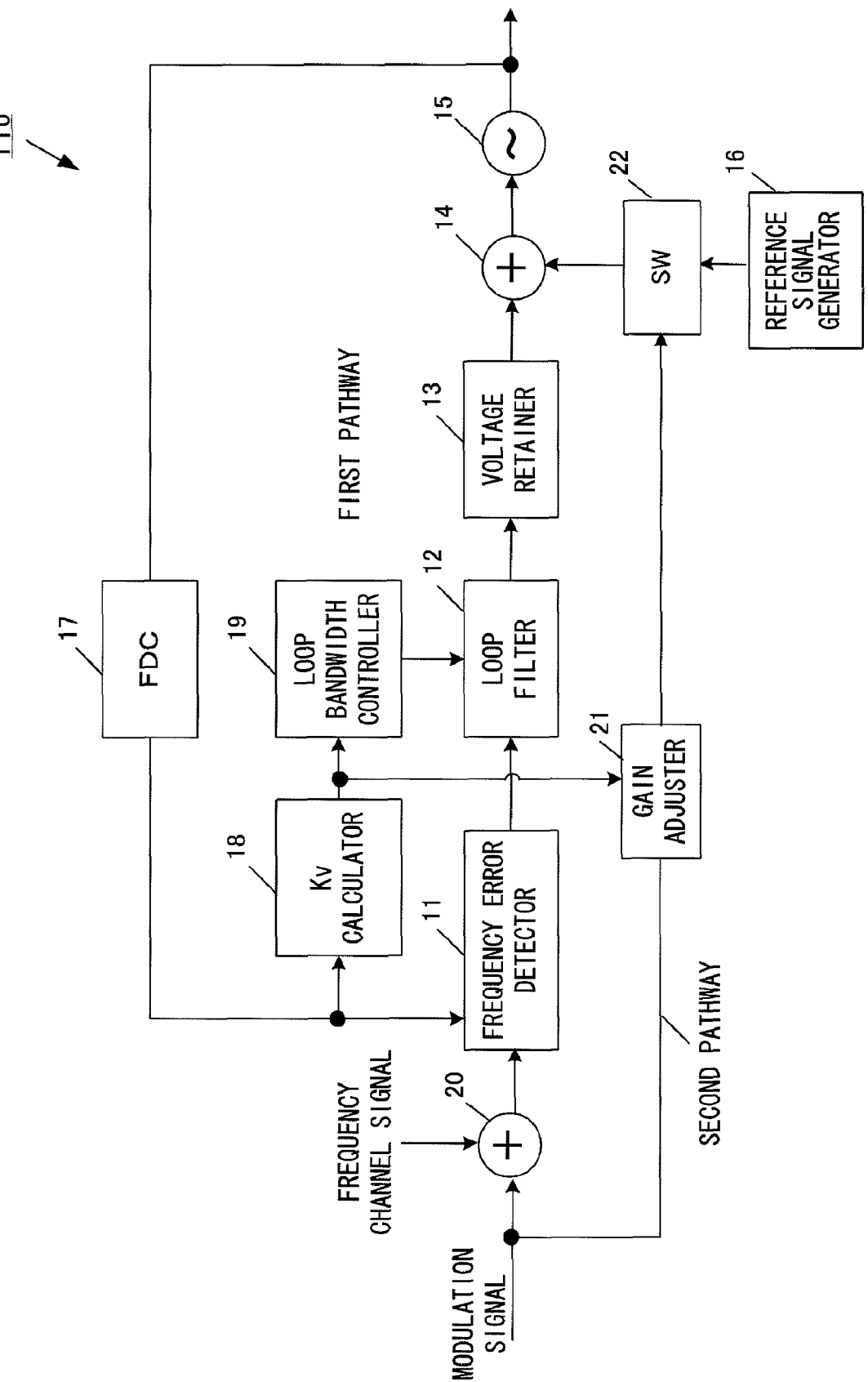
FIG. 7A is a block diagram showing one example of a configuration of an FLL circuit 110 according to a second embodiment of the present invention.

A second embodiment of the present invention will be described next. FIG. 7A is a block diagram showing one example of a configuration of an FLL circuit 110 according to the second embodiment of the present invention. The FLL circuit 110 according to the second embodiment is one in which the FLL circuit 100 according to the first embodiment is applied to a two-point modulator. In FIG. 7A, the FLL circuit 110 includes: the frequency error detector 11; the loop filter 12; the voltage retainer 13; the adder 14; the VCO 15; the reference signal generator 16; the FDC 17; the Kv calculator 18; the loop bandwidth controller 19; an adder 20; a gain adjuster 21; and a SW (switch) 22.

Thus, when compared to the FLL circuit 100 according to the first embodiment, the FLL circuit 110 according to the second embodiment further includes: the adder 20, the gain adjuster 21, and the SW 22. The adder 20 adds the modulation signal and the frequency channel signal, and outputs the result to the frequency error detector 11. The gain adjuster 21 multiplies the modulation signal by an appropriate multiplication value MV, and adjusts the output frequency of the VCO 15. In addition, the gain adjuster 21 can adjust the multiplication value MV based on the gain Kv of the VCO calculated by the Kv calculator 18.

For example, the gain adjuster 21 increases the multiplication value MV when the gain Kv of the VCO decreases as a result of temperature change or deterioration due to aging. On the other hand, the gain adjuster 21 decreases the multiplication value MV when the gain Kv of the VCO increases. Even when the gain Kv of the VCO changes, the output frequency of the FLL circuit 110 can be maintained at a constant by having the gain adjuster 21 adjust the multiplication value MV to an appropriate value based on the gain Kv of the VCO calculated by the Kv calculator 18. The SW 22 switches the connection with the adder 14 from the gain adjuster 21 to the reference signal generator 16, while the reference signal generator 16 is generating the reference signal. Descriptions of other configurations are omitted, since the other configurations are similar to those in the first embodiment.

An operation of the FLL circuit 110 will be described next. First, the operation of the FLL circuit 110 when conducting a two-point modulation is described. The modulation signal is inputted into the FLL circuit 110. The modulation signal inputted into the FLL circuit 110 is branched out to two pathways, and is supplied to the VCO 15 as the control voltage. In a first pathway, the modulation signal is inputted into the VCO 15 via the frequency error detector 11, the loop filter 12, the voltage retainer 13, and the adder 14. In a second pathway, the modulation signal is inputted into the VCO 15 via the gain adjuster 21, the SW 22, and the adder 14. The VCO 15 generates an output signal having a frequency that is in accordance with the control voltage. The first pathway allows a low frequency component of the modulation signal to pass through; and the second pathway allows a high-frequency component of the modulation signal to pass through. The VCO 15 generates an output signal with the original modulation signal as a result of, a signal from the first pathway and a signal from the second pathway being combined by the adder 14.

Figure 8A:
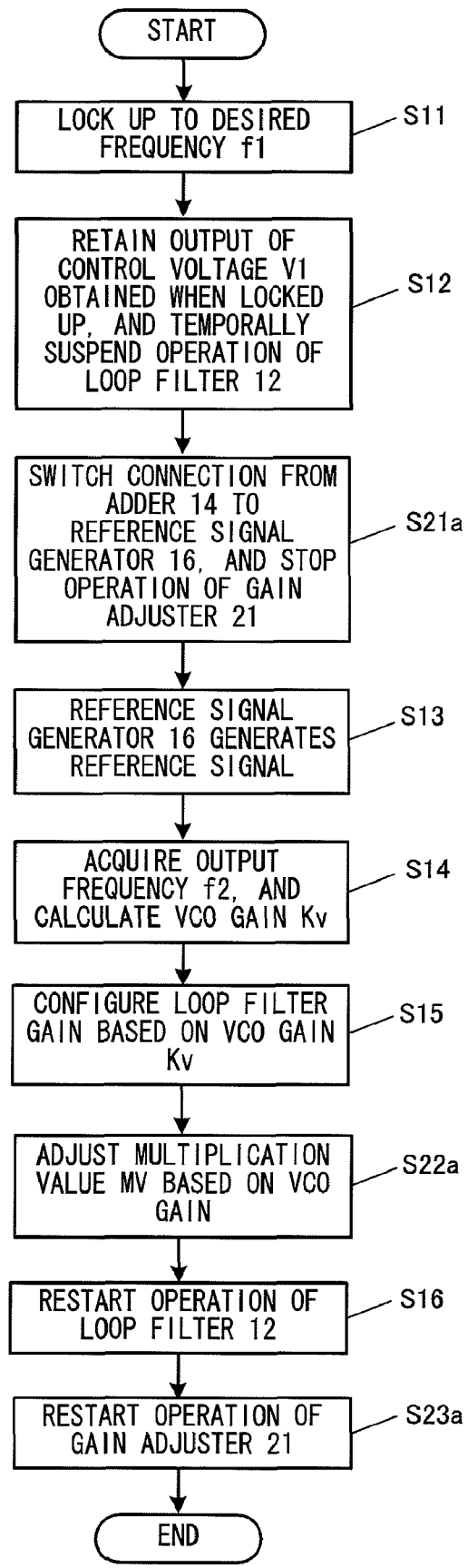
FIG. 8A is a flowchart describing an outline of an operation of the FLL circuit 110 according to the second embodiment of the present invention.

The operation when the FLL circuit 110 configures the loop bandwidth will be described next. FIG. 8A is a flowchart describing an outline of the operation when the FLL circuit 110 configures the loop bandwidth. Desirably, configuring the loop bandwidth is conducted in a short time period when the FLL circuit 110 is not transmitting information. When configuring the loop bandwidth, only the frequency channel signal is inputted into the FLL circuit 110, and the modulation signal is not inputted into the FLL circuit 110.

With reference to FIG. 8A, when compared to the operation of the FLL circuit 100 according to the first embodiment (FIG. 2), the operation of the FLL circuit 110 differs only in parts of the operation at step S21a, step S22a, and step S23a; and in parts of the operation at steps S11 to S16 are identical. More specifically, after the voltage retainer 13 temporally suspends a part of the operation of the loop filter 12 at step S12 (i.e. after switching to the open-loop), the SW 22 switches the connection with the adder 14 to a connection with the reference signal generator 16, and temporally suspends an operation of the gain adjuster 21 (step S21a).

Next, at step S15, after the loop bandwidth controller 19 configures the gains $K_1$ and $K_2$ of the loop filter 12 to the optimum values, the gain adjuster 21 adjusts the multiplication value MV based on the gain Kv of the VCO calculated by the Kv calculator 18 (step S22a). Specifically, the gain adjuster 21 increases the multiplication value MV so as to suppress an influence of a decrease in the gain Kv of the VCO, when the gain Kv of the VCO calculated by the Kv calculator 18 decreases. On the other hand the gain adjuster 21 decreases the multiplication value MV so as to suppress an influence of an increase in the gain Kv of the VCO, when the gain Kv of the VCO calculated by the Kv calculator 18 increases. A part of the operation at step S22a may be omitted if it is not necessary for the FLL circuit 110 to adjust the multiplication value MV.

Next, after the voltage retainer 13 restarts the operation of the loop filter 12 at step S16 (i.e. after switching to the closed-loop), the SW 22 switches the connection with the adder 14 to a connection with the gain adjuster 21, and restarts the operation of the gain adjuster 21 (step S23a). As a result of the operation described above, the FLL circuit 110 is capable of configuring the desired loop bandwidth in a short period of time and adjusting the multiplication value MV of the gain adjuster 21 to the optimum value, even when the sensitivity of the VCO 15 fluctuates.

Figure 7B:
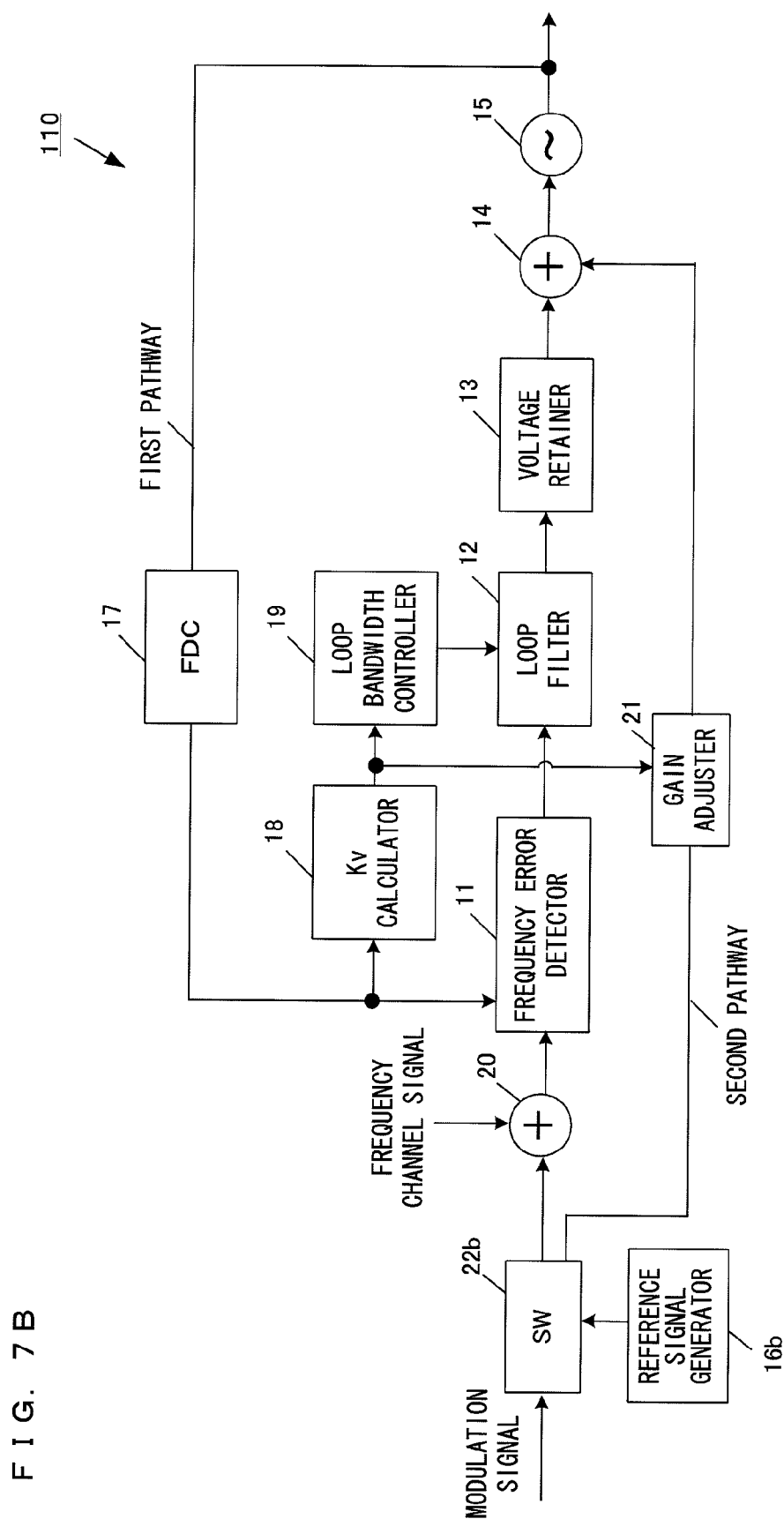
FIG. 7B is a block diagram showing one example of a configuration of an FLL circuit 120 according to the second embodiment of the present invention.

Furthermore, other than the configuration shown in FIG. 7A, the FLL circuit according to the second embodiment can have a configuration shown in FIG. 7B. FIG. 7B is a block diagram showing one example of a configuration of an FLL circuit 120 according to the second embodiment. When compared to the configuration shown in FIG. 7A, positions, where a reference signal generator 16b and a SW 22b are disposed at, are different in the FLL circuit 120 in FIG. 7B. The reference signal generator 16b generates the reference signal that can be represented by the frequency. The modulation signal and the reference signal are inputted into the SW 22b. The SW 22b switches the outputs of the modulation signal and the reference signal at an appropriate timing.

Specifically, while the voltage retainer 13 is retaining the output of the control voltage of the VCO 15 and while the operation of the loop filter 12 is stopped (i.e. while operating in the open-loop), the SW 22b conducts a switching such that the reference signal generator 16b and the gain adjuster 21 are connected. Thus, the SW 22b conducts the switching such that the reference signal is outputted to the gain adjuster 21. Furthermore, after the voltage retainer 13 restarts the operation of the loop filter 12 (i.e. after switching to the closed-loop), the SW 22b conducts a switching such that an input terminal (not diagrammatically represented) where the modulation signal is inputted, and the adder 20 and the gain adjuster 21 are connected. Thus the SW 22b conducts the switching such that the modulation signal is outputted to the adder 20 and the gain adjuster 21.

Figure 8B:
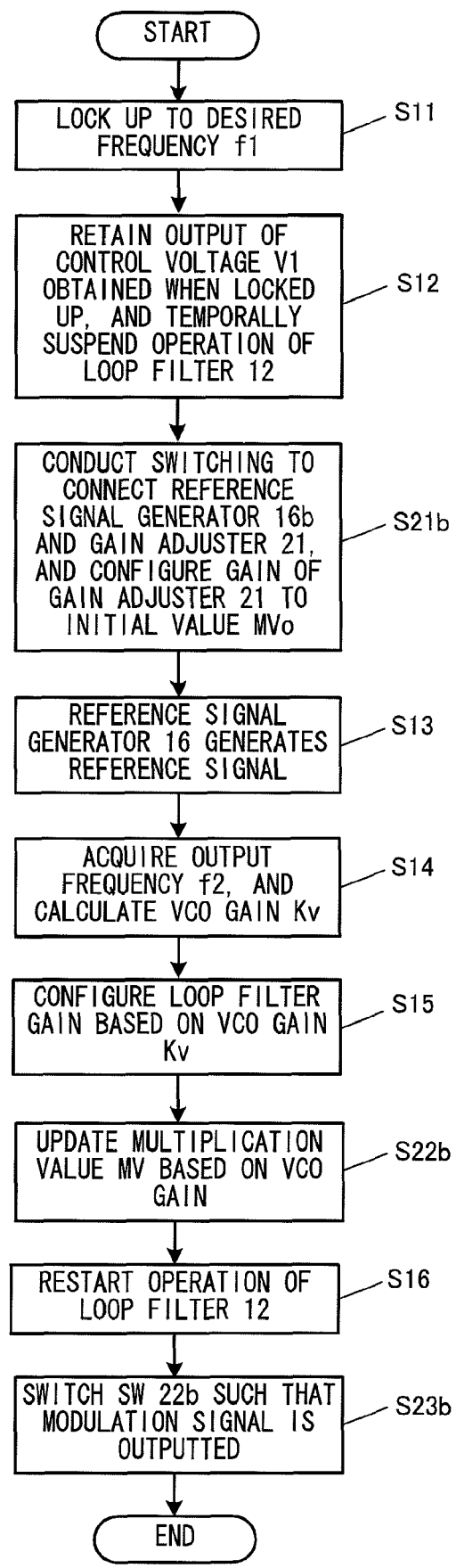
FIG. 8B is a flowchart describing an outline of an operation of the FLL circuit 120 according to the second embodiment of the present invention.

The operation when the FLL circuit 120 configures the loop bandwidth will be described next. FIG. 8B is a flowchart describing an outline of the operation when the FLL circuit 120 configures the loop bandwidth. With reference to FIG. 8B, when compared to the operation of the FLL circuit 100 (FIG. 2) according to the first embodiment and the operation of the FLL circuit 110 (refer FIG. 8), the operation of the FLL circuit 120 differs only in parts of the operation at step S21b, step S22b, and step S23b; and in parts of the operation at steps S11 to S16 are identical.

More specifically, after the voltage retainer 13 temporally suspends the operation of the loop filter 12 at step S12 (i.e. after switching to the open-loop), the SW 22 conducts the switching such that the reference signal generator 16b and the gain adjuster 21 are connected. In addition, the gain adjuster 21 configures the multiplication value MV to an initial value $MV_0$ (step S21b). The reference signal generated by the reference signal generator 21 is inputted into the VCO 15 via the gain adjuster 21 and the adder 14.

When a degree of frequency transition of the reference signal is defined as $f_{ref}$, a relationship between the degree of frequency transition $f_{ref}$ and the predefined voltage $V_D$ will be a relationship indicated by formula 14. Here, α is a gain of a D/A converter (not diagrammatically represented, and mounted, for example, next after the gain adjuster 21) and the like.

$$V_D = f_{ref} \cdot MV_0 \cdot \alpha \quad \text{(formula 14)}$$

Thus, the gain Kv of the VCO can be represented by using formula 15. Here, the degree of frequency transition $f_{ref}$ of the reference signal, the initial value $MV_0$, and α are all known. Therefore the Kv calculator 18 can calculate the gain Kv of the VCO by using formula 15 at step S14.

$$Kv = (f2 - f1)/V_D = \frac{f2 - f1}{f_{fref} \cdot MV_0 \cdot \alpha} \quad \text{(formula 15)}$$

Next, at step S15, after the loop bandwidth controller 19 configures the gain $K_1$ and $K_2$ of the loop filter 12 to the optimum values, the gain adjuster 21 adjusts the multiplication value MV from the initial value $MV_0$ to an optimum value based on the gain Kv of the VCO calculated by the Kv calculator 18 (step S22b). Specifically, the gain adjuster 21 increases the multiplication value MV so as to suppress an influence of a decrease in the gain Kv of the VCO, when the gain Kv of the VCO calculated by the Kv calculator 18 decreases. On the other hand, the gain adjuster 21 decreases the multiplication value MV so as to suppress an influence of an increase in the gain Kv of the VCO, when the gain Kv of the VCO calculated by the Kv calculator 18 increases.

Next, after the voltage retainer 13 restarts the operation of the loop filter 12 at step S16 (i.e. after switching to the closed-loop), the SW 22b conducts the switching such that the modulation signal is outputted (step S23b). As a result of the operation described above, the FLL circuit 120 can adjust the desired loop bandwidth in a short period of time and adjust the multiplication value MV of the gain adjuster 21 to the optimum value, even when the sensitivity of the VCO 15 fluctuates.

Third Embodiment

A third embodiment of the present invention will be described next. Since an FLL circuit 120 according to the third embodiment of the present invention has a configuration that is similar the FLL circuit 100 according to the first embodiment and the FLL circuit 110 according to the second embodiment, the FLL circuit 120 is described by utilizing FIG. 1 and FIG. 7. The invention is described in the first and second embodiments assuming that an influence of a carrier wave frequency drift does not exist. However, the FLL circuit 100 and the FLL circuit 110 according to the first and second embodiments operate in the open-loop when measuring the gain Kv of the VCO. In addition, the second pathway in the FLL circuit 200 according to the second embodiment forms the open-loop. In the open-loop, the carrier wave frequency drift is generated due to an influence of a leak current at the filter, and the like. Thus, there is a possibility that, in fact, the FLL circuit 100 and the FLL circuit 110 according to the first and second embodiments generate the carrier wave frequency drift and affect a measured value. Therefore, in the third embodiment, the FLL circuit 120 that avoids the influence of the carrier wave frequency drift is described.

Figure 9:
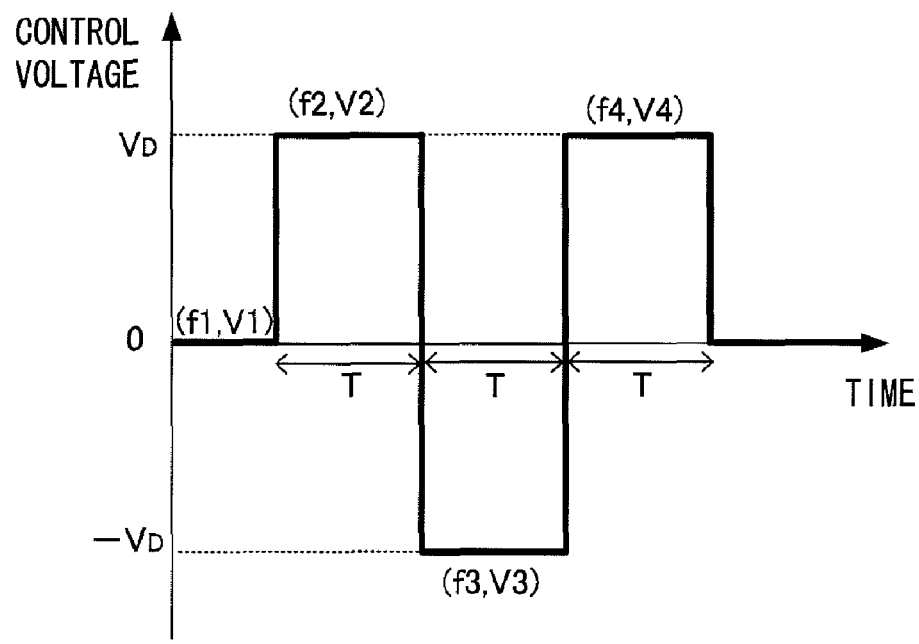
FIG. 9 shows one example of a waveform of a reference signal C generated by the reference signal generator 16.

By using the FLL circuit 120 according to the third embodiment, a reference signal, which is different from the reference signals of the first and second embodiments, is generated by the reference signal generator 16. FIG. 9 shows one example of a waveform of a reference signal C generated by the reference signal generator 16. The reference signal C shown in FIG. 9 has a waveform that results in an output having, the predefined voltage $V_D$ for the predefined time period T, and then the predefined voltage $-V_D$ for the next predefined time period T, and then the predefined voltage $V_D$ for the next predefined time period T.

Figure 10:
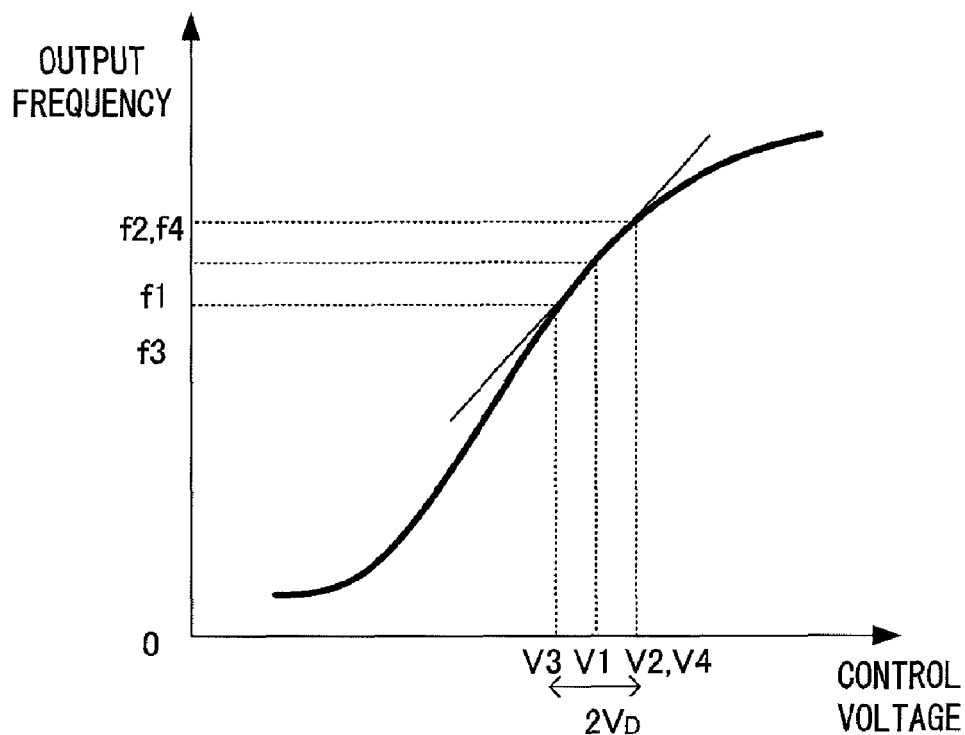
FIG. 10 shows a relationship between the control voltage and the output frequency of the VCO 15 (VF curve)

FIG. 10 shows a relationship between the control voltage and the output frequency of the VCO 15 (VF curve). As shown in FIG. 10, the control voltages of the VCO 15 obtained when the output frequencies of the VCO 15 are locked at f1, f2, f3, and f4, are respectively defined as V1, V2, V3, and V4. Note that, the output frequency and the control voltage of the VCO 15, obtained at the second time the voltage of the reference signal C becomes $V_D$, are respectively defined as f4 and V4. Thus, (f1,V1), (f2,V2), (f3,V3), and (f4,V4) shown in FIG. 9 indicate combinations of the output frequencies and the control voltages of the VCO 15 at each respective time. However, it is necessary to configure the interval (i.e. voltage $2V_D$) between the control voltage V2 and the control voltage V3 to be sufficiently small, such that there are no large changes between inclinations of the VF curve when the control voltage V2 is generated and when the control voltage V3 is generated.

Figure 11:
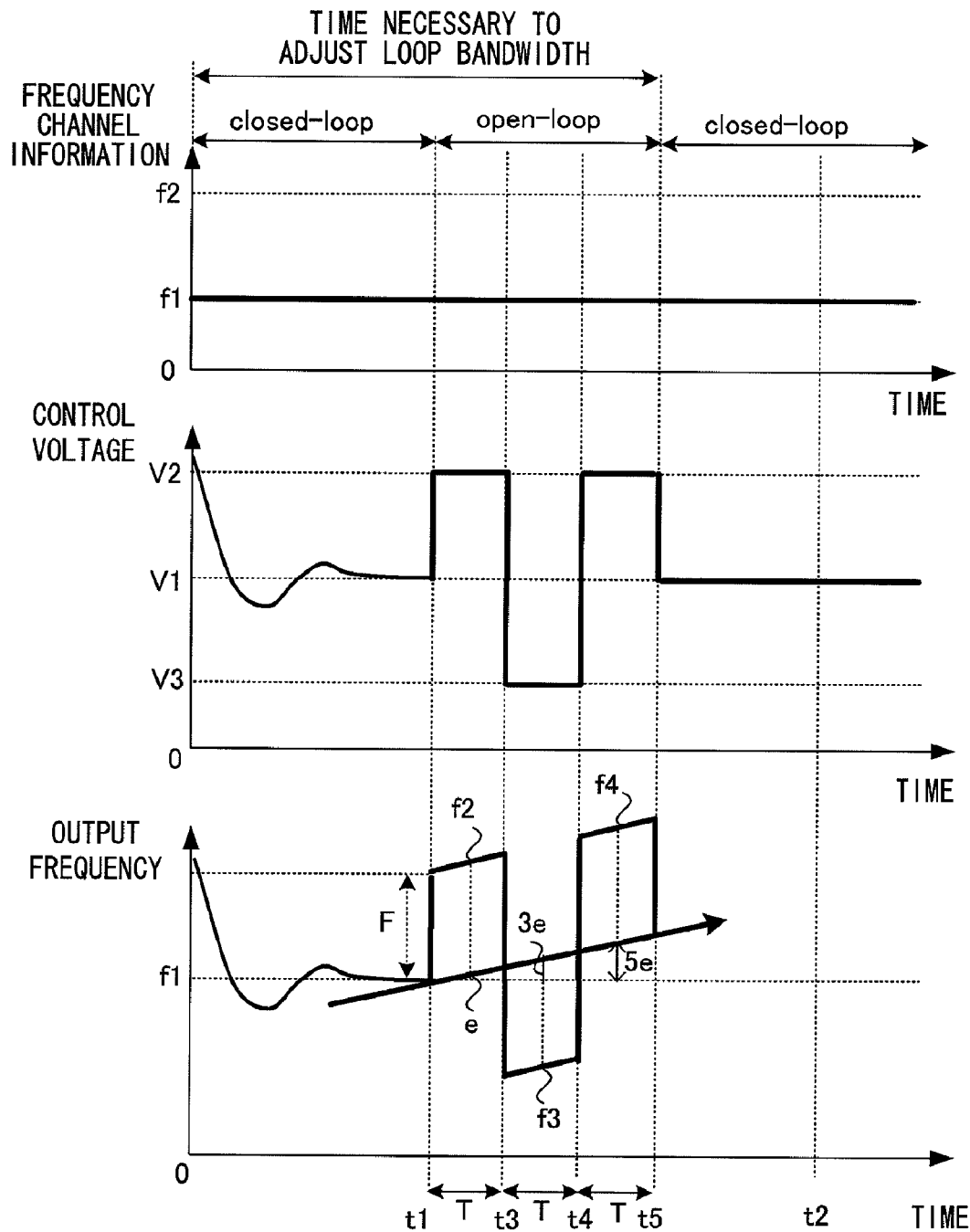
FIG. 11 is a figure that describes an advantageous effect of the FLL circuit 120 according to a third embodiment of the present invention.

FIG. 11 is a figure that describes an advantageous effect of the FLL circuit 120. With reference to FIG. 11, when an actual degree of frequency transition generated by applying the reference signal C (predefined voltage $V_D$, $-V_D$) to the control voltage V1 is defined as F, the frequencies f2, f3, and f4 detected by the Kv calculator 18 can be represented by using formula 16. Here, "e" represents an error component as a result of the carrier wave frequency drift.

$$f2 = f1 + F + e$$
$$f3 = f1 - F + 3e$$
$$f4 = f1 + F + 5e \quad \text{(formula 16)}$$

From formula 16, the degree of frequency transition F can be represented as formula 17. Therefore, by using the reference signal C, the FLL circuit 120 can calculate the degree of frequency transition F capable of avoiding the influence of the carrier wave frequency drift. Thus, the Kv calculator 18 can calculate the gain Kv of the VCO capable of avoiding the influence of the carrier wave frequency drift from formula 18. Furthermore, similarly, the gain adjuster 21 is capable of configuring the optimum multiplication value MV which can avoid the influence of the carrier wave frequency drift. In addition, configuring the loop bandwidth can be finished at a time period t5, which is shorter than the time period t2, even when using the reference signal C.

$$F = \frac{f2 - 2f3 + f4}{4} \qquad \text{(formula 17)}$$

$$\begin{aligned} Kv &= F/(V2-V1) \\ &= (f2+f4-2f3)/4(V2-V1) \\ &= (f2+f4-2f3)/4V_D \end{aligned} \qquad \text{(formula 18)}$$

Although the reference signal C in FIG. 9 has a waveform in which the predefined voltage $V_D$, the predefined voltage $-V_D$, and the predefined voltage $V_D$ are generated continuously in this order without any interruptions; the reference signal C may be one in which, a waveform having the predefined voltage $V_D$ is generated, and then after a certain period of time, a waveform having the predefined voltage $-V_D$ is generated, and then after another certain period of time, a waveform having the predefined voltage $V_D$ is generated. Furthermore, although, with the reference signal C in FIG. 9, the generated waveform results in the predefined voltage $V_D$, and the predefined voltage $-V_D$ that has the same absolute value as the predefined voltage $V_D$ but with inverted plus and minus of the predefined voltage $V_D$; the absolute value of the predefined voltage $V_D$ and the absolute value of the voltage with inverted plus and minus, do not necessary have to be identical. Furthermore, although, in the reference signal C, predefined voltages are generated in the order of, $V_D$, $-V_D$, and $V_D$; the reference signal C may be one in which the predefined voltages are generated in the inverse order as, $-V_D$, $V_D$, and $-V_D$.

Fourth Embodiment

Figure 12:
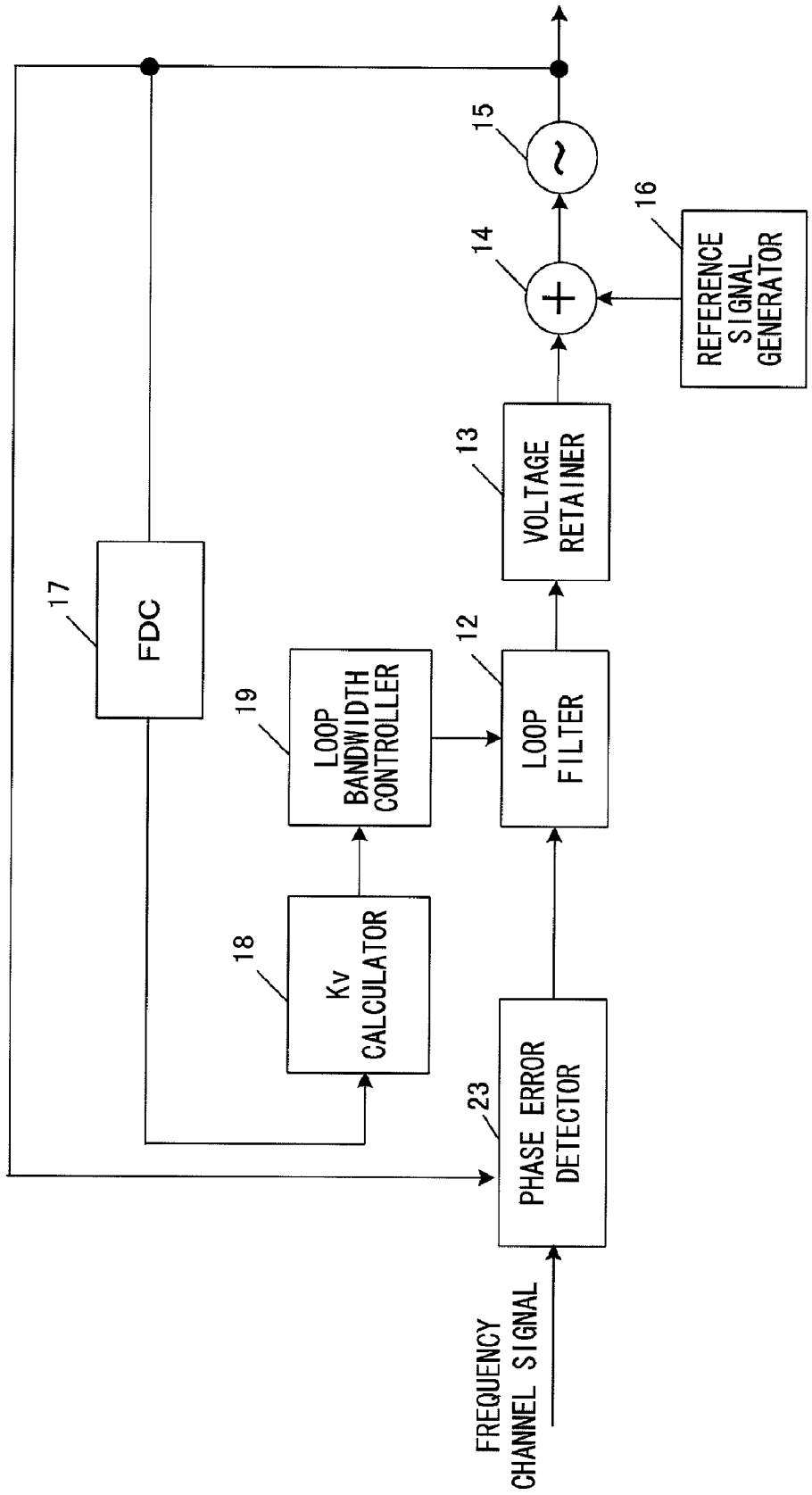
FIG. 12 is a block diagram showing one example of a configuration of a PLL circuit 200 according to a fourth embodiment of the present invention.

A fourth embodiment of the present invention will be described next. The invention according to the first embodiment is applied to a PLL circuit in the fourth embodiment. FIG. 12 is a block diagram showing one example of a configuration of a PLL circuit 200 according to the fourth embodiment of the present invention. In FIG. 12, the PLL circuit 200 includes: a phase error detector 23; the loop filter 12; the voltage retainer 13; the adder 14; the VCO 15; the reference signal generator 16; the FDC 17; the Kv calculator 18; and the loop bandwidth controller 19.

Thus, when compared to the FLL circuit 100 according to the first embodiment, the PLL circuit 200 has a configuration in which the frequency error detector 11 is substituted by the phase error detector 23. The feedback of the output signal of the VCO 15 is provided to the phase error detector 23. The phase error detector 23 compares the frequency channel signal and the output signal of the VCO 15, and detects a frequency error of the output signal of the VCO 15. Descriptions of other configurations are omitted, since the other configurations are similar to those in the first embodiment. The PLL circuit 200 according to the fourth embodiment has a capability of obtaining an advantageous effect similar to that of the FLL circuit 100 according to the first embodiment.

Fifth Embodiment

Figure 13:
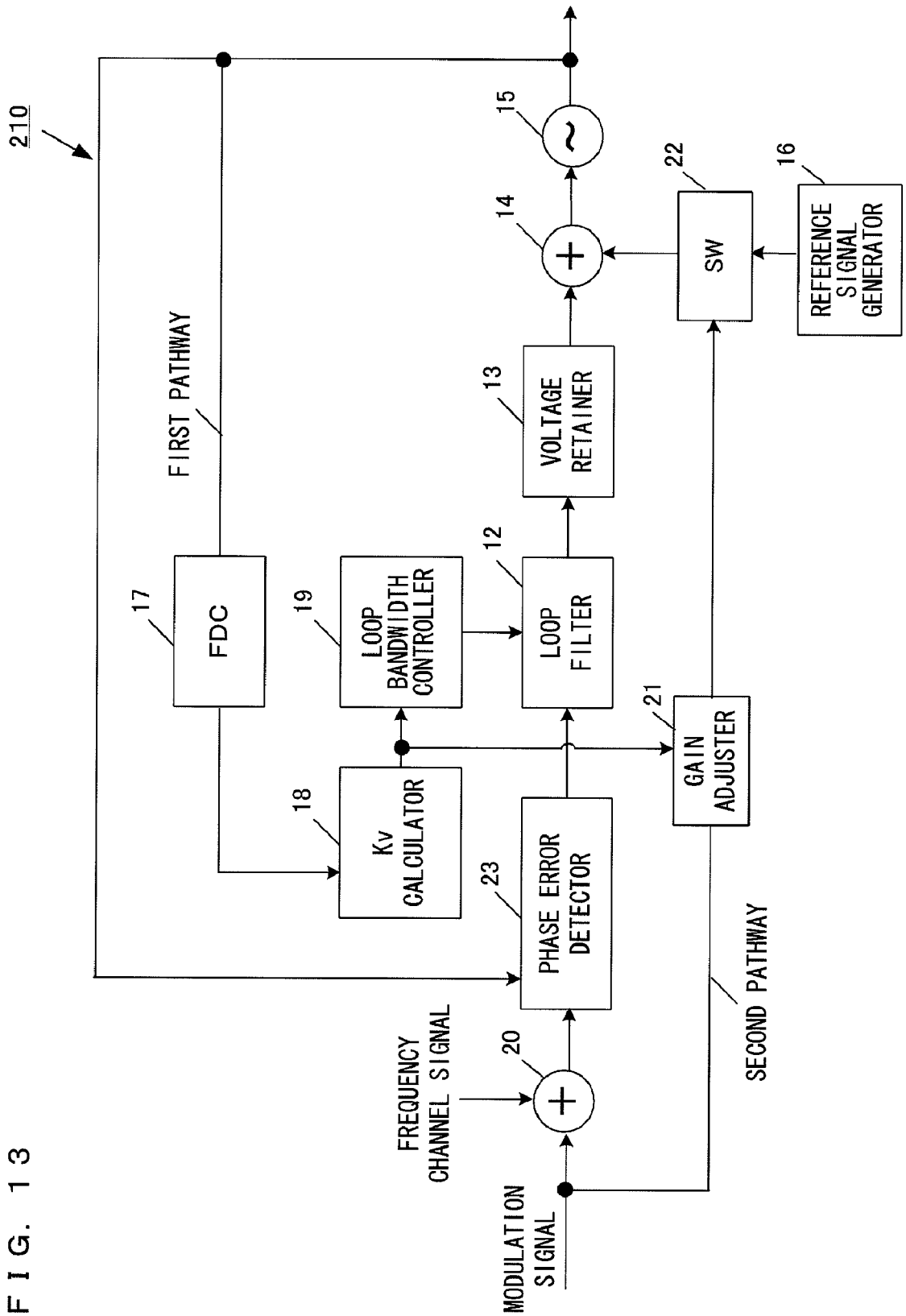
FIG. 13 is a block diagram showing one example of a configuration of a PLL circuit 210 according to a fifth embodiment of the present invention.

A fifth embodiment of the present invention will be described next. The invention according to the second embodiment is applied to a PLL circuit in the fifth embodiment. FIG. 13 is a block diagram showing one example of a configuration of a PLL circuit 210 according to the fifth embodiment of the present invention. In FIG. 13, the PLL circuit 210 includes: the phase error detector 23; the loop filter 12; the voltage retainer 13; the adder 14; the VCO 15; the reference signal generator 16; the FDC 17; the Kv calculator 18; the loop bandwidth controller 19; the adder 20; the gain adjuster 21; and the SW 22.

Thus, when compared to the FLL circuit 110 according to the second embodiment, the PLL circuit 210 has a configuration in which the frequency error detector 11 is substituted by the phase error detector 23. The feedback of the output signal of the VCO 15 is provided to the phase error detector 23. The phase error detector 23 compares the frequency channel signal and the output signal of the VCO 15, and detects a frequency error of the output signal of the VCO 15. Descriptions of other configurations are omitted, since the other configurations are similar to those in the second embodiment. The PLL circuit 210 according to the fifth embodiment has a capability of obtaining an advantageous effect similar to that of the FLL circuit 110 according to the second embodiment.

Sixth Embodiment

A sixth embodiment of the present invention will be described next. The invention according to the third embodiment is applied to a PLL circuit in the sixth embodiment of the present invention. Since a PLL circuit 220 according to the sixth embodiment has a configuration similar to the PLL circuit 200 according to the fourth embodiment and the PLL circuit 210 according to the fifth embodiment; FIG. 12 and FIG. 13 are utilized for the description. In the PLL circuit 220 according to the sixth embodiment, the reference signal generated by the reference signal generator 16 is different from the reference signals in the fourth and fifth embodiments, and the reference signal C shown in FIG. 9 is generated. As a result, the PLL circuit 220 according to the sixth embodiment has a capability of obtaining an advantageous effect similar to that of the FLL circuit 120 according to the third embodiment.

Seventh Embodiment

Figure 14:
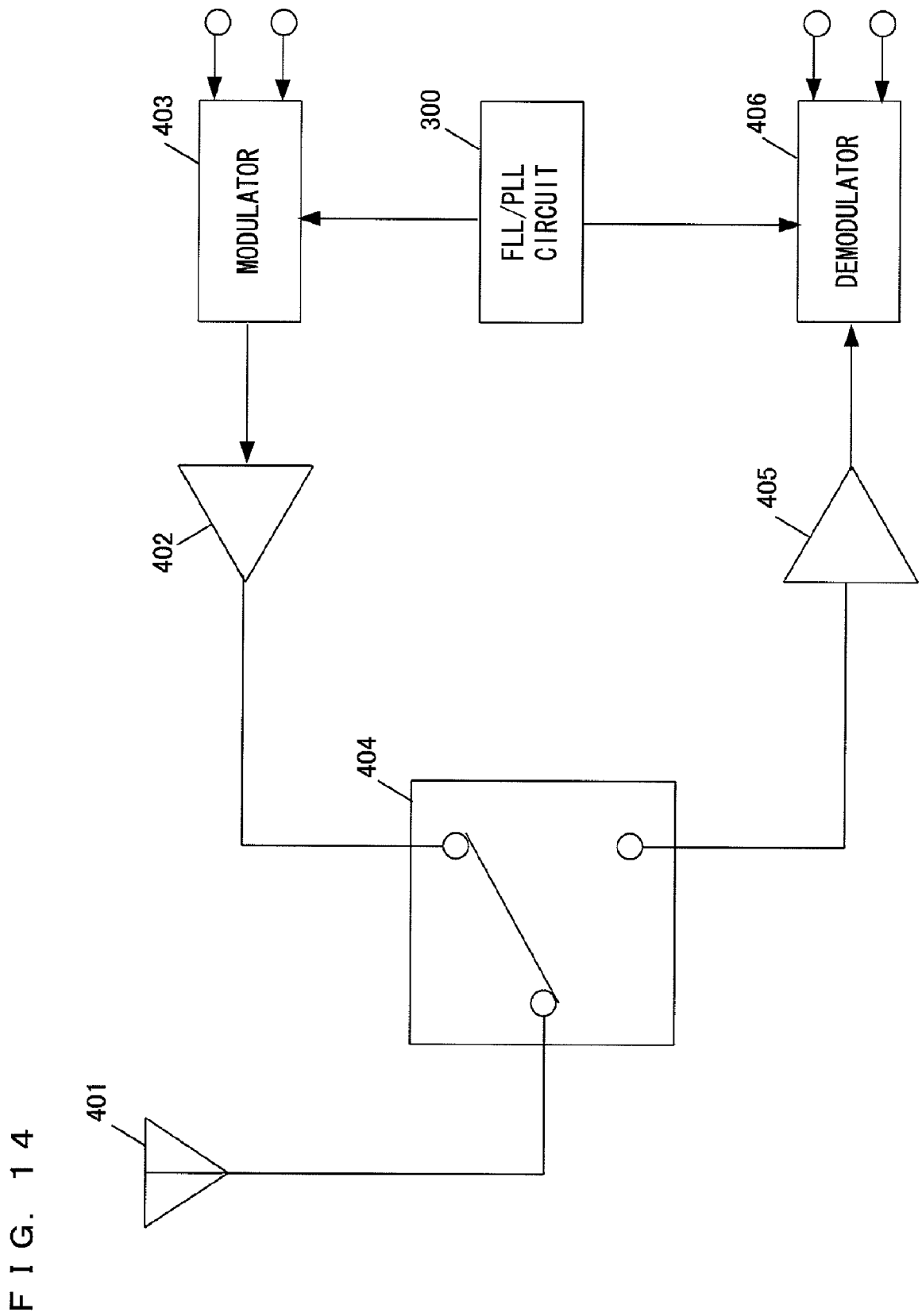
FIG. 14 is a block diagram showing a configuration example of a wireless communication device 400 according to a sixth embodiment of the present invention.
Figure 15:
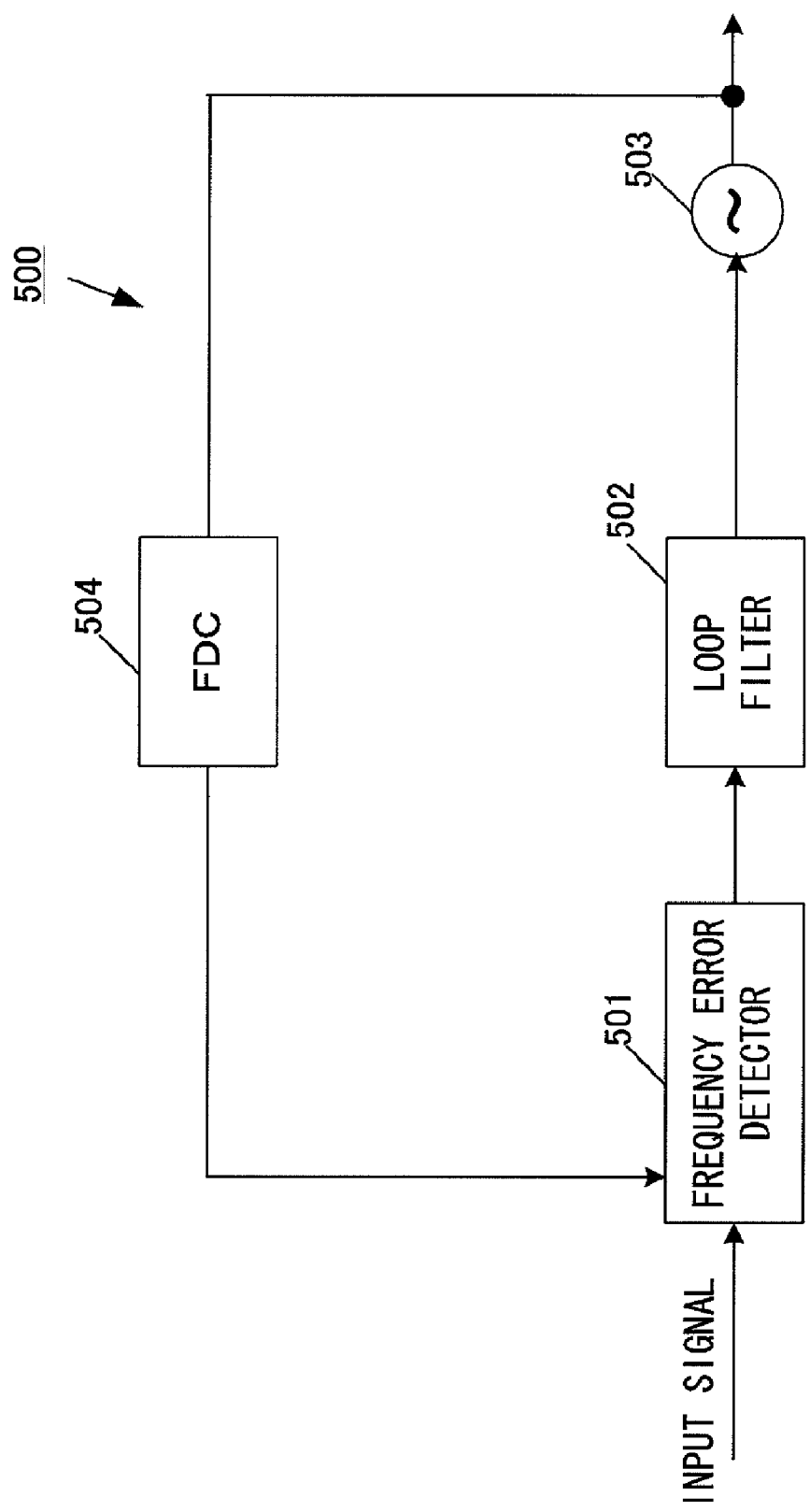
FIG. 15 is a block diagram showing a configuration of a conventional FLL circuit 500.
Figure 16:
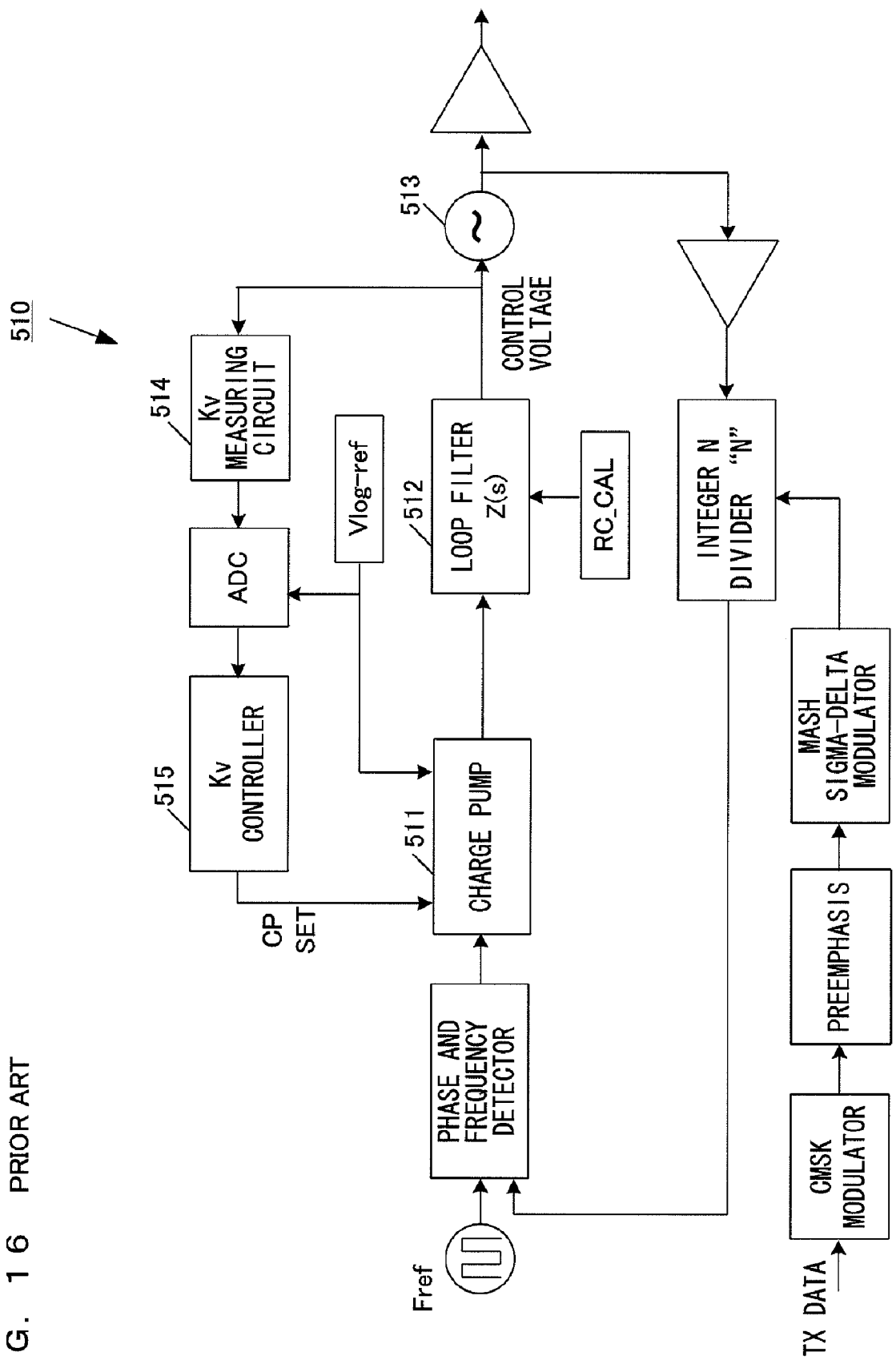
FIG. 16 is a block diagram showing one example of the conventional PLL circuit 510.

FIG. 14 is a block diagram showing a configuration example of a wireless communication device 400 that uses the FLL/PLL circuit according to the first to sixth embodiments. As shown in FIG. 14, the wireless communication device 400 includes: an antenna 401; a power amplifier 402; a modulator 403; a switch 404; an amplifier 405; a demodulator 406; and an FLL/PLL circuit 300.

When transmitting a wireless signal, the modulator 403 modulates a desired high frequency signal outputted from the FLL/PLL circuit 300 by using a baseband modulation signal; and outputs the resulting signal. A desired high frequency modulation signal outputted from the modulator 403 is amplified by the power amplifier 402, and released from the antenna 401 via the switch 403. When receiving a wireless signal, a high frequency modulation signal received by the antenna 401 is inputted into the amplifier 405 via the switch 404 and amplified, and is inputted into the demodulator 406. The demodulator 406 demodulates the inputted high frequency modulation signal into a baseband modulation signal by using the high frequency signal outputted from the FLL/PLL circuit 300. A plurality of FLL/PLL circuits 300 may be used on a transmission side and a reception side. Furthermore, the FLL/PLL circuit 300 may function also as a modulator.

The FLL/PLL circuit according to the present invention can be applied in a wireless communication device and the like, such as a mobile phone, a wireless LAN, and the like.

While the invention has been described in detail, the foregoing description is in all aspects illustrative and not restrictive. It is understood that numerous other modifications and variations can be devised without departing from the scope of the invention.

What is claimed is:

1. An FLL/PLL circuit that generates, based on an input signal, an output signal having a desired frequency, the FLL/PLL circuit comprising:
    a VCO which is supplied with a control voltage that is in accordance with the input signal, and which generates an output signal having a desired frequency that is in accordance with the control voltage;
    a feedback section that generates a feedback of the output signal of the VCO;
    an error detector that detects an error of the output signal of the VCO by comparing the generated feedback of the output signal of the VCO and the input signal;
    a loop filter which suppresses a high-frequency component of an output signal of the error detector, and which inputs the resulting signal into the VCO;
    a voltage retainer that retains an output of the control voltage of the VCO obtained when locked up at a first frequency;
    a reference signal generator that generates a predefined reference signal when the voltage retainer retains the output of the control voltage of the VCO;
    an adder that adds the reference signal to the control voltage outputted by the voltage retainer;
    a Kv calculator that calculates a gain Kv of the VCO, based on a degree of transition of an output frequency of the VCO, which is a difference between an output frequency of the VCO when locked up at the first frequency and an output frequency of the VCO when the reference signal is added; and
    a loop bandwidth controller which configures, based on the gain Kv of the VCO calculated by the Kv calculator, a gain of the loop filter to the optimum value, and which configures a desired loop bandwidth.

2. The FLL/PLL circuit according to claim 1, wherein the voltage retainer:
    stops, while the reference signal generator is generating the reference signal, an operation of the loop filter by retaining the output of the control voltage of the VCO obtained when locked up at the first frequency; and
    restarts, when the reference signal generator stops generating the reference signal, the operation of the loop filter by inputting the output signal of the loop filter into the VCO.

3. The FLL/PLL circuit according to claim 1, wherein the reference signal has a waveform that results in an output of a predefined voltage $V_D$ for a predefined time period.

4. The FLL/PLL circuit according to claim 3, wherein
    the first frequency is defined as f1, the control voltage of the VCO obtained when locked up at the first frequency f1 is defined as V1, the output frequency of the VCO when the predefined voltage $V_D$ of the reference signal is added to the control voltage V1 is defined as f2, and the control voltage is defined as V2,
    the Kv calculator calculates the gain Kv of the VCO from the following formula $$Kv = (f2 - f1)/(V2 - V1)$$
$$= (V2 - V1)/V_D.$$

5. The FLL/PLL circuit according to claim 1, wherein the reference signal has a waveform that results in an output having a predefined voltage $V_D$ for a predefined time period, and then in an output having a predefined voltage -$V_D$ for the next predefined time period.

6. The FLL/PLL circuit according to claim 5, wherein
    the first frequency is defined as f1, the control voltage of the VCO obtained when locked up at the first frequency f1 is defined as V1, the output frequency and the control voltage of the VCO when the predefined voltage $V_D$ of the reference signal is added to the control voltage V1 are respectively defined as f2 and V2, and the output frequency and the control voltage of the VCO when the predefined voltage -$V_D$ of the reference signal is added to the control voltage V1 are respectively defined as f3 and V3,
    the Kv calculator calculates the gain Kv of the VCO from the following formula.

$$Kv = (f2 - f3)/(V2 - V3)$$
$$= \left(\frac{f2}{2} - \frac{f3}{2}\right)/(V2 - V1)$$
$$= \left(\frac{f2}{2} - \frac{f3}{2}\right)/V_D.$$

7. The FLL/PLL circuit according to claim 1, wherein the reference signal has a waveform that results in an output having a predefined voltage $V_D$ for a predefined time period, then in an output having a predefined voltage -$V_D$ for the next predefined time period, and then in an output having the predefined voltage $V_D$ for the next predefined time period.

8. The FLL/PLL circuit according to claim 7, wherein
    the first frequency is defined as f1, the control voltage of the VCO obtained when locked up at the first frequency f1 is defined as V1, the output frequency and the control voltage of the VCO when the predefined voltage $V_D$ of the reference signal is added to the control voltage V1 are respectively defined as f2 and V2, the output frequency and the control voltage of the VCO when the predefined voltage -$V_D$ of the reference signal is added to the control voltage V1 are respectively defined as f3 and V3, and the output frequency and the control voltage of the VCO when the next predefined voltage $V_D$ of the reference signal is added to the control voltage V1 are respectively defined as f4 and V4,
    the Kv calculator calculates the gain Kv of the VCO from the following formula.

$$Kv = (f2 + f4 - 2f3)/4(V2 - V1)$$
$$= (f2 + f4 - 2f3)/4V_D.$$

9. The FLL/PLL circuit according to claim 1, wherein the loop bandwidth controller configures a gain of the loop filter to an optimum value such that a product, obtained by multiplying the gain Kv of the VCO calculated by the Kv calculator by the gain of the loop filter, becomes a constant value.

10. The FLL/PLL circuit according to claim 1, wherein
a frequency channel signal and a modulation signal are inputted into the FLL/PLL circuit as the input signal, and the FLL/PLL circuit further comprises:
- a second adder which adds the frequency channel signal and the modulation signal, and which outputs the result to the error detector;
- a gain adjuster which multiplies the inputted modulation signal and a multiplication value, and which outputs the multiplied modulation signal to the VCO via the adder; and which adjusts an output frequency of the VCO; and
- a switch that switches a connection with the adder from the gain adjuster to the reference signal generator while the reference signal generator is generating the reference signal.

11. The FLL/PLL circuit according to claim 10, wherein the gain adjuster adjusts the multiplication value based on the gain Kv of the VCO calculated by the Kv calculator.

12. The FLL/PLL circuit according to claim 10, wherein the gain adjuster: increases, when the gain Kv of the VCO calculated by the Kv calculator decreases, the multiplication value so as to suppress an influence of a decrease in the gain Kv of the VCO; and decreases, when the gain Kv of the VCO calculated by the Kv calculator increases, the multiplication value so as to suppress an influence of an increase in the gain Kv of the VCO.

13. The FLL/PLL circuit according to claim 1, wherein
a frequency channel signal and a modulation signal are inputted into the FLL/PLL circuit as the input signal, and the FLL/PLL circuit further comprises:
- a second adder which adds the frequency channel signal and the modulation signal, and which outputs the result to the error detector;
- a gain adjuster which multiplies the inputted modulation signal and a multiplication value, and which outputs the multiplied modulation signal to the VCO via the adder; and which adjusts an output frequency of the VCO; and
- a switch that switches the output, from the modulation signal to the reference signal, while the reference signal and the modulation signal are being inputted and while the reference signal generator is generating the reference signal.

14. A wireless communication device comprising the FLL/PLL circuit according to claim 1.

* * * * *